United States Patent
Oh

(10) Patent No.: US 9,130,160 B2
(45) Date of Patent: *Sep. 8, 2015

(54) NON-VOLATILE MEMORY DEVICE HAVING MULTI-LEVEL CELLS AND METHOD OF FORMING THE SAME

(71) Applicant: Samsung Electronics Co., Ltd., Suwon-si (KR)

(72) Inventor: Gyu-Hwan Oh, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/336,007

(22) Filed: Jul. 21, 2014

(65) Prior Publication Data

US 2014/0326942 A1    Nov. 6, 2014

Related U.S. Application Data

(63) Continuation of application No. 13/791,970, filed on Mar. 9, 2013, now Pat. No. 8,830,739.

(30) Foreign Application Priority Data

Jun. 18, 2012    (KR) ......................... 10-2012-0065102

(51) Int. Cl.
*G11C 11/00*    (2006.01)
*H01L 45/00*    (2006.01)
(Continued)

(52) U.S. Cl.
CPC ........ *H01L 45/1233* (2013.01); *G11C 11/5678* (2013.01); *H01L 27/2409* (2013.01); *H01L 27/2463* (2013.01); *H01L 45/04* (2013.01); *H01L 45/06* (2013.01); *H01L 45/126* (2013.01); *H01L 45/1273* (2013.01); *H01L 45/141* (2013.01); *H01L 45/143* (2013.01); *H01L 45/144* (2013.01); *H01L 45/1683* (2013.01); *G11C 13/0004* (2013.01); *G11C 13/0069* (2013.01)

(58) Field of Classification Search
CPC . H01L 45/06; H01L 45/1233; H01L 45/1226; H01L 45/126; H01L 45/04; G11C 13/0004; G11C 11/5678; G11C 5/025; G11C 5/02
USPC ........................ 365/163, 148, 51, 63; 257/2, 4
See application file for complete search history.

(56) References Cited

U.S. PATENT DOCUMENTS 7,254,059 B2    8/2007  Li et al.
7,696,508 B2    4/2010  Song et al.
(Continued)

FOREIGN PATENT DOCUMENTS

KR    1020070102295    10/2007
KR    1020080102895    11/2008

*Primary Examiner* — David Lam
(74) *Attorney, Agent, or Firm* — Myers Bigel Sibley & Sajovec, P.A.

(57) ABSTRACT

A non-volatile memory device including multi-level cells is provided. The device includes first and second conductive patterns. Additionally, the device includes an electrode structure and a data storage pattern between the first and second conductive patterns. The data storage pattern may include a phase change material and a first vertical thickness of a first portion of the data storage pattern may be less than a second vertical thickness of a second portion of the data storage pattern. The electrode structure may include first and second electrodes and a vertical thickness of the first electrode may be greater than that of the second electrode.

20 Claims, 23 Drawing Sheets

(51) Int. Cl.
    *G11C 11/56* (2006.01)
    *H01L 27/24* (2006.01)
    *G11C 13/00* (2006.01)

(56) References Cited

U.S. PATENT DOCUMENTS

| | | | |
|---|---|---|---|
| 7,812,332 B2 | 10/2010 | Oh et al. | |
| 7,943,965 B2 | 5/2011 | Kim | |
| 8,243,506 B2 * | 8/2012 | Liu | 365/163 |
| 8,283,650 B2 * | 10/2012 | Breitwisch et al. | 257/4 |
| 8,830,739 B2 * | 9/2014 | Oh | 365/163 |
| 2006/0077741 A1 | 4/2006 | Wang et al. | |
| 2010/0012913 A1 | 1/2010 | Lee | |
| 2010/0093130 A1 | 4/2010 | Oh et al. | |
| 2011/0121250 A1 | 5/2011 | Lee | |
| 2011/0242884 A1 | 10/2011 | Eleftheriou et al. | |

* cited by examiner

NON-VOLATILE MEMORY DEVICE HAVING MULTI-LEVEL CELLS AND METHOD OF FORMING THE SAME

CROSS-REFERENCE TO RELATED APPLICATION

This application is a continuation of U.S. patent application Ser. No. 13/791,970, filed Mar. 9, 2013, now U.S. Pat. No. 8,830,739, which claims priority under 35 U.S.C. §119 to Korean Patent Application No. 10-2012-0065102 filed on Jun. 18, 2012, in the Korean Intellectual Property Office, and the benefit accruing therefrom under 35 U.S.C. §119. The disclosures of the above referenced applications are hereby incorporated by reference herein in their entireties.

FIELD

The present disclosure generally relates to the field of electronics, and more particularly semiconductor devices.

BACKGROUND

Phase-change random access memories (PRAMs) having multi-level cells may be considered to increase the memory density because the multi-level cells can store multi-bits data in one cell without increasing the memory size. The multi-level cells in PRAM may be implemented by cells having several resistance levels.

SUMMARY

A non-volatile memory device may include a first conductive pattern on a substrate, a switching device on the first conductive pattern, and an electrode structure on the switching device. The device may further include a data storage pattern self-aligned to the electrode structure and a second conductive pattern on the data storage pattern. The electrode structure may include a first electrode, which is electrically connected to the switching device and in contact with the data storage pattern, and a second electrode, which is electrically connected to the switching device and in contact with the data storage pattern, and the second electrode may have a resistivity greater than that of the first electrode.

In various embodiments, the second electrode may include a material having a resistivity greater than a material included in the first electrode.

According to various embodiments, the device may also include a first resistive pattern between the first electrode and the second electrode and a second resistive pattern on a surface of the second electrode opposite the first resistive pattern.

In various embodiments, the first and second resistive patterns may include a material having a resistivity greater than that of the first and second electrodes.

According to various embodiments, the first and second resistive patterns may include an insulating material.

In various embodiments, the first resistive pattern may include a material different from that the second resistive pattern includes.

According to various embodiments, the first and second resistive patterns may have different widths.

A programming method of a non-volatile memory device including a data storage pattern, which has a first resistance level, a second resistance level greater than the first resistance level, a third resistance level greater than the second resistance level, and a fourth resistance level greater than the third resistance level corresponding to a current applied to an electrode structure and wherein the current is selectable to provide a first set current, a second set current greater than the first set current, a first reset current, and a second reset current greater than the first reset current or a sequential combination thereof, may include applying the second set current and the first reset current sequentially to the electrode structure to make the data storage pattern have the second resistance level.

In various embodiments, the non-volatile memory device may further include a first conductive pattern and a second conductive pattern on sides of the electrode structure. Each of the first set current and the second set current may have a quenching waveform with a lower quenching speed compared to that of the first reset current and the second reset current after a current pulse is applied between the first conductive pattern and the second conductive pattern. Each of the first reset current and the second reset current may have a quenching waveform with a higher quenching speed compared to that of the first set current and the second set current after a current pulse is applied between the first conductive pattern and the second conductive pattern.

According to various embodiments, the programming method may further include applying the second set current to the electrode structure to make the data storage pattern have the first resistance level.

In various embodiments, the programming method may further include applying the second reset current and first set current sequentially to the electrode structure to make the data storage pattern have the third resistance level.

According to various embodiments, the programming method may further include applying the second reset current to the electrode structure to make the data storage pattern have the fourth resistance level.

In various embodiments, the non-volatile memory device may also include a switching device electrically connected to the electrode structure and the electrode structure may include a first electrode in contact with the data storage pattern and a second electrode in contact with the data storage pattern. The second electrode may have a vertical height less than that of the first electrode.

According to various embodiments, a portion of the data storage pattern contacting the first electrode may be in an amorphous state and a remaining portion of the data storage pattern may be in a crystalline state when the data storage pattern has the second resistance level.

In various embodiments, the electrode structure may further include a first resistive pattern and a second resistive pattern. Moreover, the first electrode may include a first upper part having a vertical height greater than a horizontal width and a first lower part having a horizontal width greater than a vertical height. The second electrode may include a second upper part having a vertical height greater than a horizontal width and a second lower part having a horizontal width greater than a vertical height. The first resistive pattern may contact a sidewall of the first upper part and a top surface of the first lower part and the second resistive pattern may contact a sidewall of the second upper part and a top surface of the second lower part.

A non-volatile memory device may include a first conductive pattern on a substrate. The device may further include an electrode structure on the first conductive pattern and the electrode structure may be electrically connected to the first conductive pattern. The device may also include a second conductive pattern on the electrode structure and a data storage pattern including a phase change material between the electrode structure and the second conductive pattern. A first vertical thickness of a first portion of the data storage pattern may be less than a second vertical thickness of a second portion of the data storage pattern.

In various embodiments, the electrode structure may include a first electrode contacting the first portion of the data storage pattern and a second electrode contacting the second portion of the data storage pattern.

According to various embodiments, a vertical thickness of the first electrode may be greater than that of the second electrode.

In various embodiments, lower surfaces of the first and second electrodes may contact the first conductive pattern at an equal level.

According to various embodiments, an upper surface of the first electrode may be disposed higher than that of the second electrode relative to the first conductive pattern.

In various embodiments, the first and second electrodes may have L-shapes,

According to various embodiments, the first electrode may have a resistivity different from that of the second electrode.

In various embodiments, the first and second electrodes may have different widths.

According to various embodiments, the device may additionally include a first resistive pattern between the first electrode and the second electrode and a second resistive pattern on a surface of the second electrode opposite the first resistive pattern.

In various embodiments, the first and second resistive patterns may include a material having a resistivity greater than that of the first and second electrodes.

According to various embodiments, the first and second resistive patterns may include an insulating material.

In various embodiments, the first resistive pattern may include a material different from that the second resistive pattern includes.

According to various embodiments, the first and second resistive patterns may have different widths.

In various embodiments, the data storage pattern may include the first data storage pattern and the device further include a second data storage pattern, which is disposed directly adjacent to the first data storage pattern. The first and second data storage patterns may have a symmetrical shape relative to each other about an axis extending between the first data storage pattern and the second data storage pattern.

According to various embodiments, the electrode structure may include the first electrode structure and the device may further include a second electrode structure, which is disposed directly adjacent to the first electrode structure. The first and second electrode structures may have a symmetrical shape relative to each other about an axis extending between the first electrode structure and the second electrode structure.

DETAILED DESCRIPTION

Figure 1:
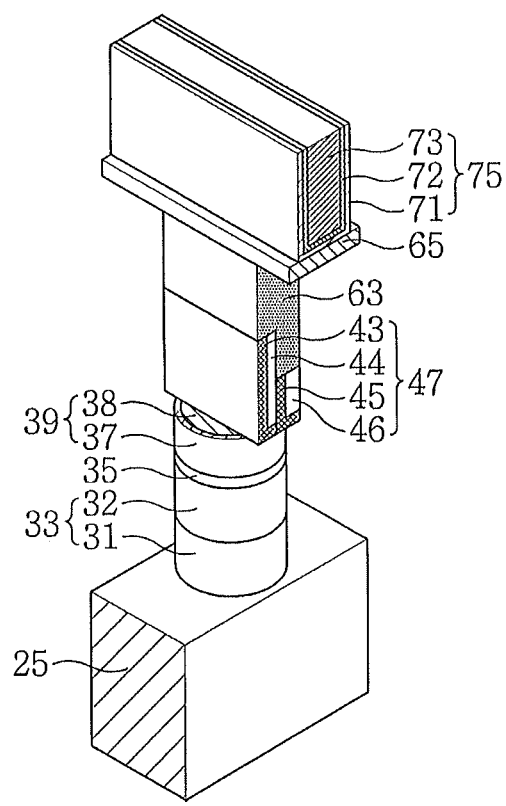
FIG. 1 is a perspective view illustrating a non-volatile memory device in accordance with some embodiments of the inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," "directly adjacent," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Figure 2:
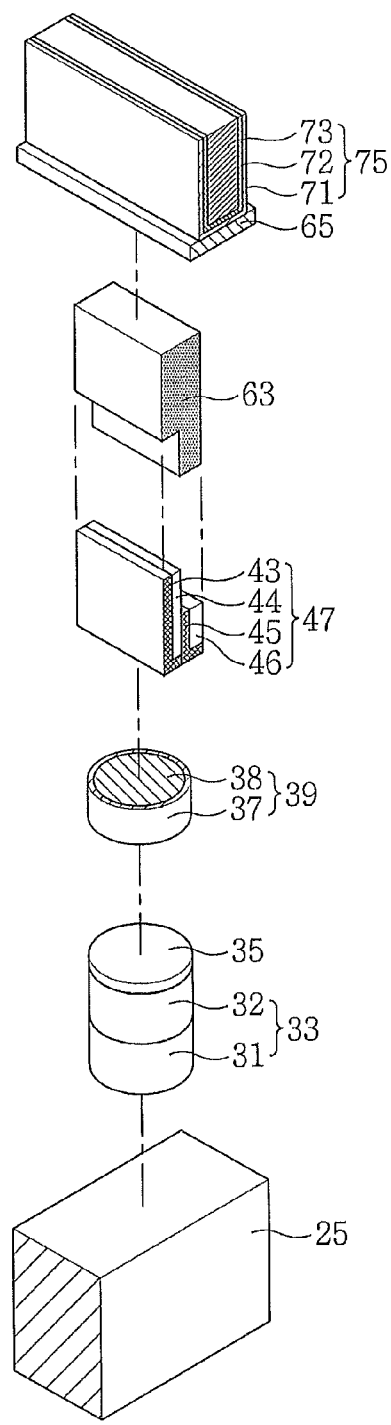
FIG. 2 is an exploded perspective view illustrating a non-volatile memory device in accordance with some embodiments of the inventive concept.

Referring to FIG. 1 and FIG. 2, a diode 33 may be formed on a word line 25. The diode 33 may include a sequentially stacked first semiconductor pattern 31 and second semiconductor pattern 32. A metal silicide pattern 35 may be formed on the diode 33. A lower pad 39 may be formed on the metal silicide pattern 35. The lower pad 39 may include a sequentially stacked first barrier metal pattern 37 and conductive pattern 38. An electrode structure 47 may be formed on the lower pad 39. The electrode structure 47 may include a first electrode 43, a first resistive pattern 44, a second electrode 45, and a second resistive pattern 46. A data storage pattern 63 may be formed on the electrode structure 47. The data storage pattern 63 may be a dash shape or a bar shape. An upper electrode 65 may be formed on the data storage pattern 63. A bit line 75 may be formed on the upper electrode 65. The bit line 75 may include a second barrier metal pattern 71, a seed layer 72, and a bit conductive layer 73.

The diode 33 may function as a switching device. The metal silicide pattern 35 may be self-aligned to the diode 33 so that sidewalls of the metal silicide pattern 35 are aligned with the sidewalls of the diode 33. The metal silicide pattern 35 may have the same shape as the diode 33. The lower pad 39 may be self-aligned to the metal silicide pattern 35. The lower pad 39 may have the same shape as the metal silicide pattern 35. For example, the diode 33, the metal silicide pattern 35, and the lower pad 39 may have a cylinder shape.

The first electrode 43 may be in contact with the lower pad 39. The first resistive pattern 44 may be formed on a side of the first electrode 43. The first electrode 43 may extend between the first resistive pattern 44 and the lower pad 39. The first electrode 43 may have an L-shape. The second electrode 45 may be in contact with the lower pad 39. The second resistive pattern 46 may be formed on a side of the second electrode 45. The second electrode 45 may be interposed between the first resistive pattern 44 and the second resistive pattern 46. The second electrode 45 may extend between the second resistive pattern 46 and the lower pad 39. The second electrode 45 may have an L-shape.

The first and second electrodes 43 and 45 may have different electrical resistances from each other. For example, a vertical height of the second electrode 45 may be smaller than that of the first electrode 43. A distance between the upper electrode 65 and the first electrode 43 may be narrower than that between the upper electrode 65 and the second electrode 45. The first electrode 43 may include a material having a different resistivity from the second electrode 45. The first electrode 43 may include a material having a lower resistivity than the second electrode 45. The first and second electrodes 43 and 45 may be in contact with the data storage pattern 63.

The first and second resistive patterns 44 and 46 may include a material having greater electrical resistance than the first and second electrodes 43 and 45. The first and second resistive patterns 44 and 46 may have different horizontal widths from each other. The first and second resistive patterns 44 and 46 may include materials having different etching selectivity from each other. For example, a vertical height of the second resistive pattern 46 may be smaller than that of the first resistive pattern 44. A horizontal width of the second resistive pattern 46 may be larger than that of the first resistive pattern 44.

The data storage pattern 63 may be self-aligned to the electrode structure 47. Sidewalls of the data storage pattern 63 may be vertically aligned with sidewalls of the electrode structure 47. A first vertical thickness of a first portion of the data storage pattern 63 may be less than a second vertical thickness of a second portion of the data storage pattern 63 when the lower surfaces of the first and second portions are aligned or when the upper surfaces of the first and second portions are aligned.

In an application embodiment, the word line 25 may correspond to a first conductive pattern, and the bit line 75 may correspond to a second conductive pattern.

Figure 3:
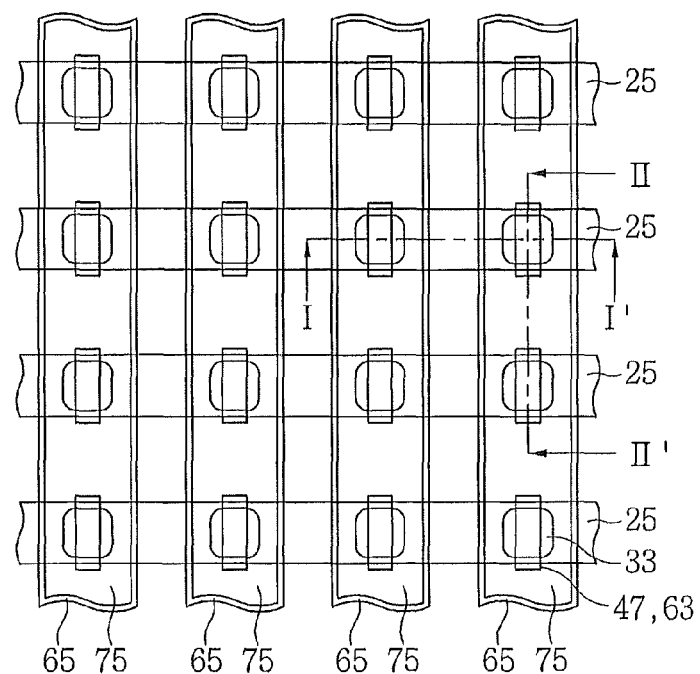
FIG. 3 is a layout illustrating a non-volatile memory device in accordance with some embodiments of the inventive concept.

Referring to FIG. 3, word lines 25 aligned parallel to each other may be formed on a cell array region of the non-volatile memory device. Upper electrodes 65 may be formed to cross over the word lines 25. Bit lines 75 may be formed on the upper electrodes 65. The bit lines 75 may intersect the word lines 25 at a right angle. Diodes 33, electrode structures 47, and data storage patterns 63 may be formed at intersections of the word lines 25 and bit lines 75.

Figure 4:
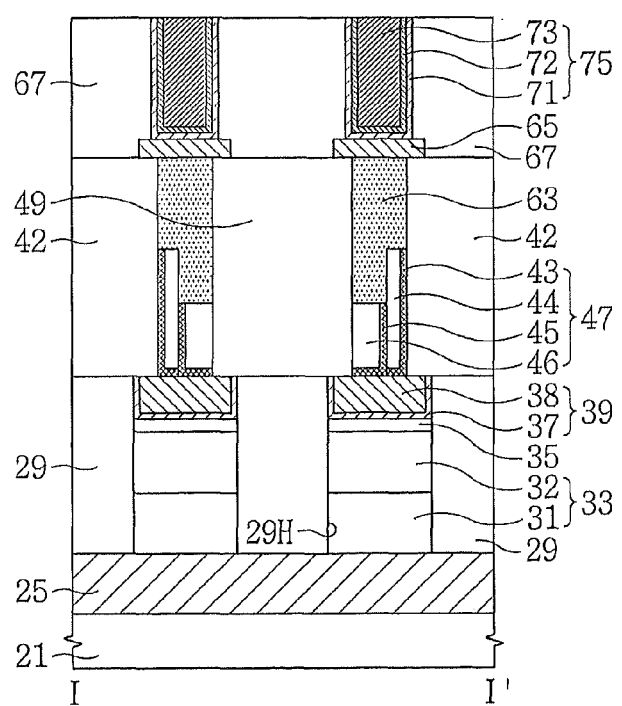
FIG. 4 is a cross-sectional view taken along a line I-I' of FIG. 3.

Referring to FIG. 3 and FIG. 4, the word lines 25 may be formed on a substrate 21. A molding layer 29 may be formed on the word lines 25. Contact holes 29H passing through the molding layer 29 may be formed. A first semiconductor pattern 31, a second semiconductor pattern 32, a metal silicide pattern 35, and a lower pad 39 may be sequentially formed inside each of the contact holes 29H. The first and second semiconductor patterns 31 and 32 may configure the diode 33. The lower pad 39 may include a conductive pattern 38 and a first barrier metal pattern 37 surrounding the sides and bottom of the conductive pattern 38. Upper surfaces of the lower pads 39 and molding layer 29 may be formed at the same level. The diodes 33, the metal silicide patterns 35, and the lower patterns 39 may fully fill the contact holes 29H.

First and second insulating patterns 42 and 49 may be formed on the molding layer 29. The first and second insulating patterns 42 and 49 may be formed alternately. The first insulating patterns 42 may partially cover the lower pads 39. The electrode structures 47 and the data storage patterns 63 may be formed between the first and second insulating patterns 42 and 49. Each of the electrode structures 47 may include a first electrode 43, a first resistive pattern 44, a second electrode 45, and a second resistive pattern 46.

The upper electrodes 65 in contact with the data storage patterns 63 may be formed on the first and second insulating patterns 42 and 49. An upper insulating layer 67 may be formed on the first insulating patterns 42, the second insulating pattern 49, and the upper electrode 65. Bit lines 75 passing through the upper insulating layer 67 and in contact with the upper electrodes 65 may be formed. Each of the bit lines 75 may include a sequentially stacked second barrier metal pattern 71, seed layer 72, and bit conductive layer 73.

Figure 5:
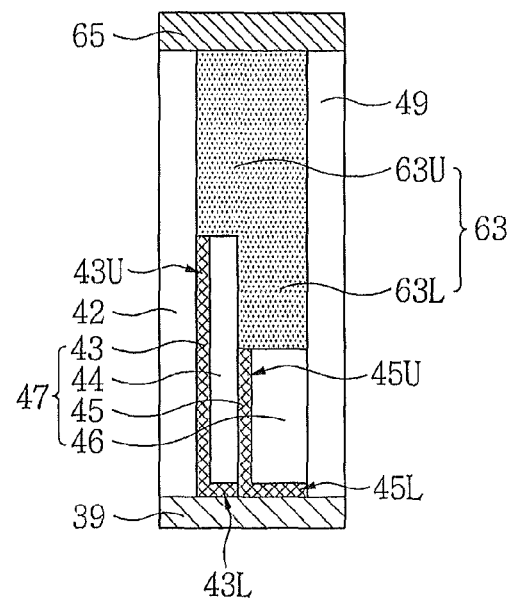
FIGS. 5 to 15, 16A through 16C, and 17A through 17E are enlarged views illustrating portions of FIG. 4 in accordance with some embodiments of the inventive concept.

Referring to FIG. 5, the data storage pattern 63 may be self-aligned to the electrode structure 47. The data storage pattern 63 and the electrode structure 47 may be vertically aligned between the first and second insulating patterns 42 and 49. The electrode structure 47 may include a first electrode 43, a first resistive pattern 44, a second electrode 45, and a second resistive pattern 46. The data storage pattern 63 may have a single body. The data storage pattern 63 may include a lower part 63L, and an upper part 63U formed on the lower part 63L. A horizontal width of the upper part 63U may be greater than that of the lower part 63L. The upper electrode 65 may be in contact with an upper end of the data storage pattern 63. The upper electrode 65 may be in contact with the upper part 63U of the data storage pattern 63.

The first electrode 43 may include a first upper part 43U having a vertical height greater than a horizontal width, and a first lower part 43L having a horizontal width greater than a vertical height. The first electrode 43 may have an L-shape. The first lower part 43L may be in contact with the lower pad 39. The first upper part 43U may be in contact with the upper part 63U of the data storage pattern 63. The first resistive pattern 44 may be in contact with a side surface of the first upper part 43U and a top surface of the first lower part 43L. The first upper part 43U may be interposed between the first resistive pattern 44 and the first insulating pattern 42. A horizontal width of the first resistive pattern 44 may be greater than that of the first upper part 43U. Upper ends of the first upper part 43U and first resistive pattern 44 may be formed at the equal level. The first resistive pattern 44 may include a material having a greater resistivity than the first electrode 43. A top surface of the first resistive pattern 44 may be in contact with the upper part 63U of the data storage pattern 63. A side of the first resistive pattern 44 may be in contact with the lower part 63L of the data storage pattern 63.

The second electrode 45 may include a second upper part 45U having a vertical height greater than a horizontal width, and a second lower part 45L having a horizontal width greater than a vertical height. The second electrode 45 may have an L-shape. The second lower part 45L may be in contact with the lower pad 39. The second upper part 45U may be in contact with the lower part 63L of the data storage pattern 63. The second resistive pattern 46 may be in contact with a side surface of the second upper part 45U and a top surface of the second lower part 45L. The second upper part 45U may be interposed between the first resistive pattern 44 and the second resistive pattern 46. The second resistive pattern 46 may be interposed between the second upper part 45U and the second insulating pattern 49. Upper ends of the second upper part 45U and second resistive pattern 46 may be formed at the equal level. The second resistive pattern 46 may include a material having a greater resistivity than the second electrode 45. An upper end of the second resistive pattern 46 may be in contact with the lower part 63L of the data storage pattern 63. A horizontal width of the second resistive pattern 46 may be greater than that of the second upper part 45U.

A vertical height of the second electrode 45 may be smaller than that of the first electrode 43. An upper end of the first electrode 43 may be formed at a higher level than an upper end of the second electrode 45. A vertical height of the first upper part 43U may be greater than that of the second upper part 45U. A distance between the upper electrode 65 and the first upper part 43U may be less than that between the upper electrode 65 and the second upper part 45U. The second electrode 45 and the first electrode include an identical material. A horizontal width of the second resistive pattern 46 may be greater than that of the first resistive pattern 44. The second resistive pattern 46 may have a different material from the first resistive pattern 44. The second resistive pattern 46 may include a material having etching selectivity with respect to the first resistive pattern 44. The second electrode 45 may be in contact with a side of the first lower part 43L.

In some embodiments, the vertical height of the second electrode 45 may be the same as that of the first electrode 43. The first electrode 43 may have a different horizontal width from the second electrode 45. The second electrode 45 may include a material having a greater resistivity than the first electrode 43. The second electrode 45 may have a greater electrical resistance than the first electrode 43. A horizontal width of the second resistive pattern 46 may be the same as or smaller than that of the first resistive pattern 44.

According to some embodiments of the inventive concept, the data storage pattern 63 and the electrode structure 47 may be provided. The first electrode 43 of the electrode structure 47 may be in contact with the upper part 63U of the data storage pattern 63. The second electrode 45 of the electrode structure 47 may be in contact with the lower part 63L of the data storage pattern 63. A contact area between the first electrode 43 and the upper part 63U may be formed at a higher level than that between the second electrode 45 and the lower part 63L. The first electrode 43 may be in contact with the data storage pattern 63 at a middle level of the data storage pattern 63. A distance between the first electrode 43 and the upper electrode 65 may be less than that between the second electrode 45 and the upper electrode 65.

A program current applied between the upper electrode 65 and the lower pad 39 may be concentrated on the first electrode 43. The program current may be concentrated at a middle level of the data storage pattern 63. The data storage pattern 63 may be switched to a crystalline state or an amorphous state according to the program current. The first electrode 43 may be very efficient for locally switching the middle area of the data storage pattern 63 to the crystalline state or the amorphous state. The configuration consisting of the first and second electrodes 43 and 45 may be very efficient for programming the data storage pattern 63 to have two or more intermediate levels of resistance between a low resistance state and a high resistance state. Due to the configuration consisting of the data storage pattern 63 and the electrode structure 47, program efficiency of the data storage pattern 63 may be significantly improved compared to that in the related art.

Figure 6:
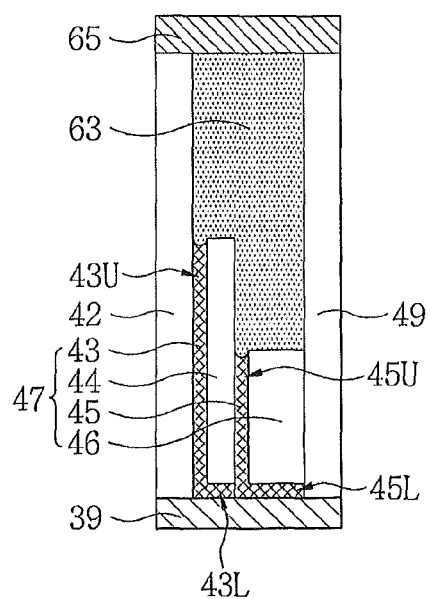

Referring to FIG. 6, a top surface of the first upper part 43U may include a concave portion. The top surface of the first upper part 43U may gradually rise toward the edge of the top surface. A top surface of the second upper part 45U may include a concave portion. The top surface of the second upper part 45U may gradually rise toward the edge of the top surface.

Figure 7:
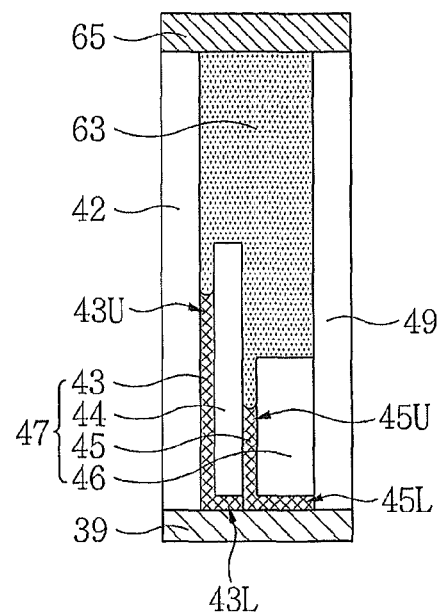

Referring to FIG. 7, the first upper part 43U may be formed at a lower level than an upper end of the first resistive pattern 44. The data storage pattern 63 may extend between the first resistive pattern 44 and the first insulating pattern 42. The second upper part 45U may be formed at a lower level than an upper end of the second resistive pattern 46. The data storage pattern 63 may extend between the first resistive pattern 44 and the second resistive pattern 46.

Figure 8:
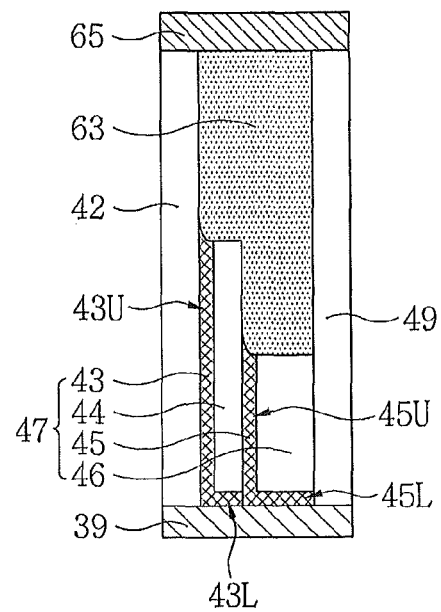

Referring to FIG. 8, the first upper part 43U may gradually rise toward a side of the first insulating pattern 42. The upper end of the first upper part 43U may protrude upward at a higher level than the first resistive pattern 44. The second upper part 45U may gradually rise toward the first resistive pattern 44. The upper end of the second upper part 45U may protrude upward at a higher level than the second resistive pattern 46.

Figure 9:
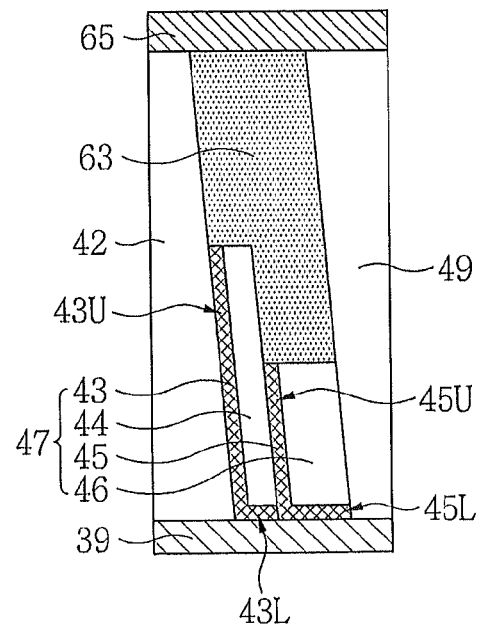

Referring to FIG. 9, a side of the first insulating pattern 42 may have an inclined profile. The first upper part 43U may have the same inclined profile as the side of the first insulating pattern 42. The second upper portion 45U may have a similarly inclined profile as a side of the first upper part 43U.

Figure 10:
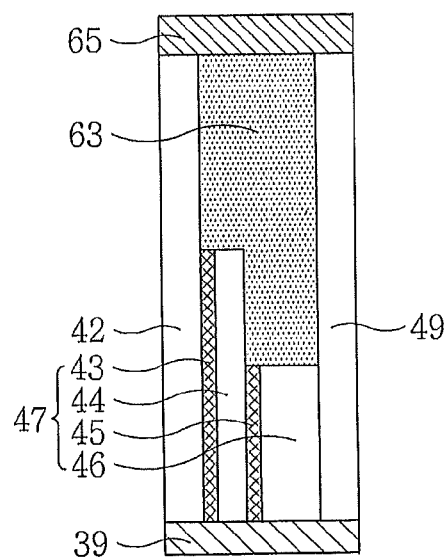

Referring to FIG. 10, lower ends of the first electrode 43, first resistive pattern 44, second electrode 45, and second resistive pattern 46 may be in contact with a top surface of the lower pad 39. The first electrode 43, the first resistive pattern 44, the second electrode 45, and the second resistive pattern 46 may have a bar shape.

Figure 11:
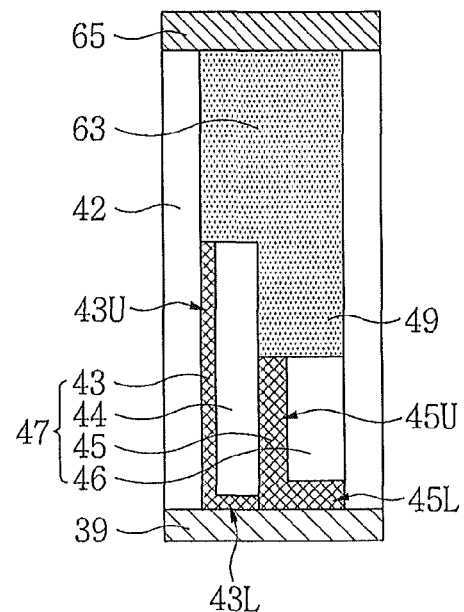

Referring to FIG. 11, a horizontal width of the second electrode 45 may be greater than that of the first electrode 43. A horizontal width of the second upper part 45U may be greater than that of the first upper part 43U.

Figure 12:
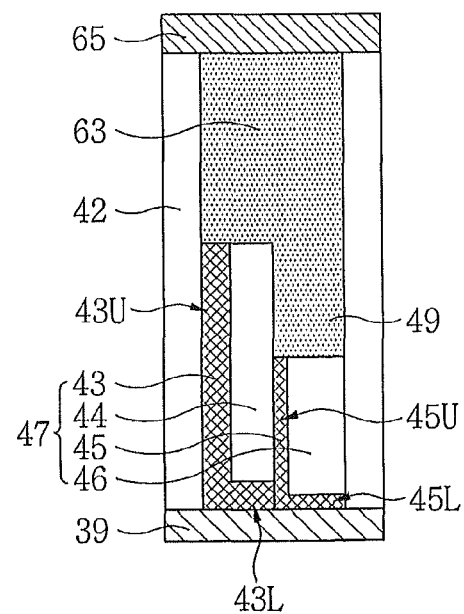

Referring to FIG. 12, the horizontal width of the first electrode 43 may be greater than that of the second electrode 45. The horizontal width of the first upper part 43U may be greater than that of the second upper part 45U.

Figure 13:
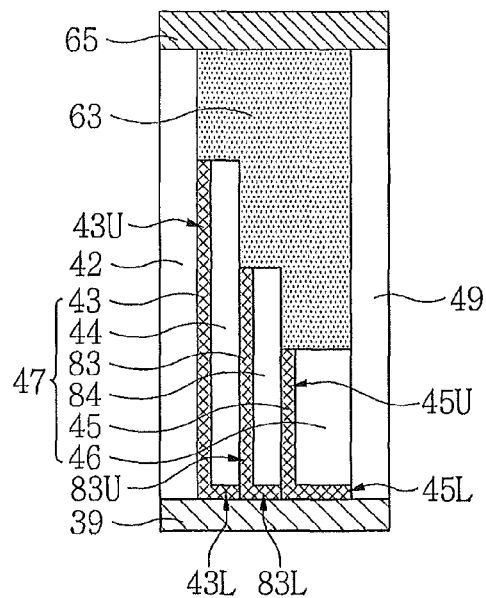

Referring to FIG. 13, the electrode structure 47 may include a third electrode 83 and a third resistive pattern 84 in addition to the first electrode 43, first resistive pattern 44, second electrode 45, and second resistive pattern 46. A vertical height of the third electrode 83 may be smaller than that of the first electrode 43 and greater than that of the second electrode 45.

The third electrode 83 may have a third upper part 83U having a vertical height greater than a horizontal width, and a third lower part 83L which has a horizontal width greater than a vertical height. The third electrode 83 may have an L-shape. The third lower part 83L may be in contact with the lower pad 39. The third upper part 83U may be in contact with the data storage pattern 63. The third resistive pattern 84 may be in contact with a side surface of the third upper part 83U and a top surface of the third lower part 83L. The third upper part 83U may be interposed between the first resistive pattern 44 and the third resistive pattern 84. Upper ends of the third upper part 83U and third resistive pattern 84 may be formed at the same level. The third resistive pattern 84 may include a material having a greater resistivity than the third electrode 83.

Figure 14:
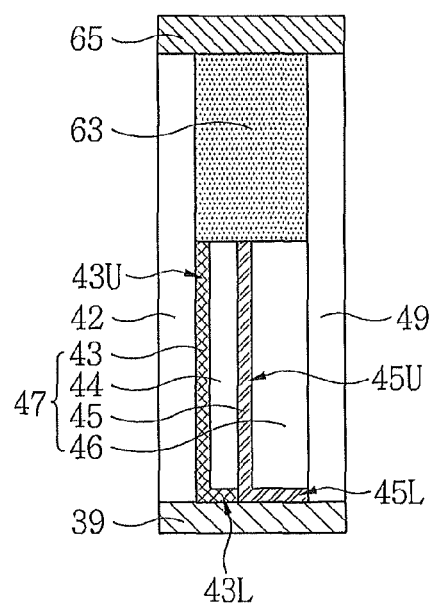

Referring to FIG. 14, the second electrode 45 may have a material having a different resistivity from the first electrode 43. For example, the second electrode 45 may include a material having a greater resistivity than the first electrode 43. The second electrode 45 may have the same vertical height as the first electrode 43. The top surfaces of the first electrode 43, first resistive pattern 44, second electrode 45, and second resistive pattern 46 may be formed at the equal level.

Figure 15:
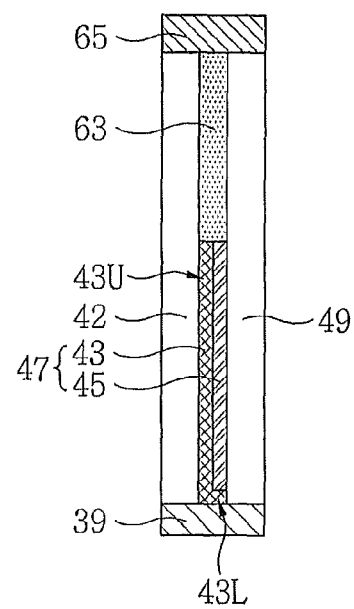

Referring to FIG. 15, the electrode structure 47 may include a first electrode 43 and a second electrode 45. The second electrode 45 may include a material having a greater resistivity than the first electrode 43.

The first electrode 43 may include a first upper part 43U having a vertical height greater than a horizontal width, and a first lower part 43L having a horizontal width greater than a vertical height. The first electrode 43 may have an L-shape. The first lower part 43L may be in contact with the lower pad 39. The first upper part 43U may be in contact with the data storage pattern 63. The second electrode 45 may be in contact with a side surface of the first upper part 43U and a top surface of the first lower part 43L. The first upper part 43U may be interposed between the second electrode 45 and the first insulating pattern 42. Upper ends of the first upper part 43U and second electrode 45 may be formed at the same level. The second electrode 45 may be in contact with the data storage pattern 63.

Figure 16A:
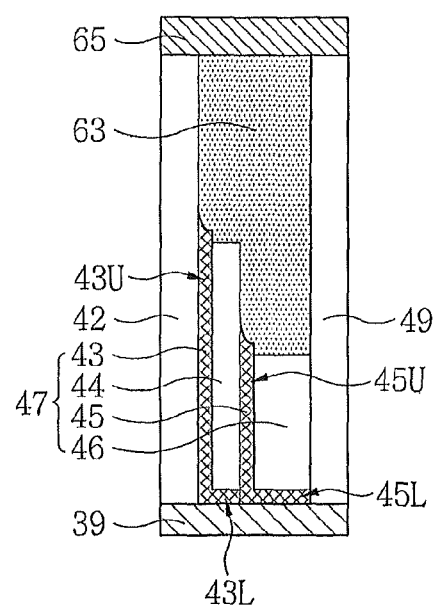

Referring to FIG. 16A, the first upper part 43U may protrude at a higher level than the first resistive pattern 44. The first upper part 43U may gradually rise toward a side of the first insulating pattern 42. The second upper part 45U may protrude at a higher level than the second resistive pattern 46. The second upper part 45U may gradually rise toward the first resistive pattern 44.

Figure 16B:
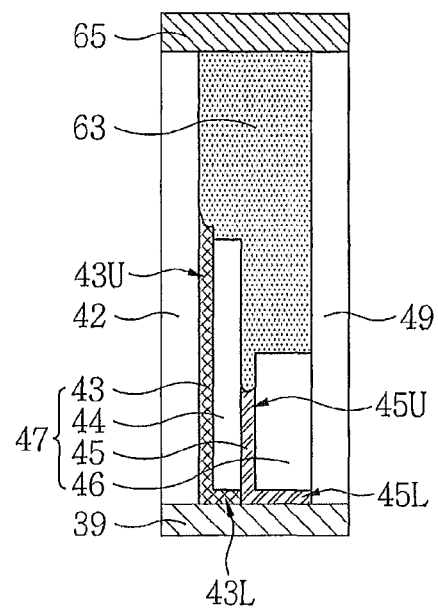

Referring to FIG. 16B, the first upper part 43U may protrude at a higher level than the first resistive pattern 44. The first upper part 43U may gradually rise toward the side of the first insulating pattern 42. The second upper part 45U may be formed at a lower level than the upper end of the second resistive pattern 46. The data storage pattern 63 may extend between the first resistive pattern 44 and the second resistive pattern 46. The second electrode 45 may include a different material from the first electrode 43.

Figure 16C:
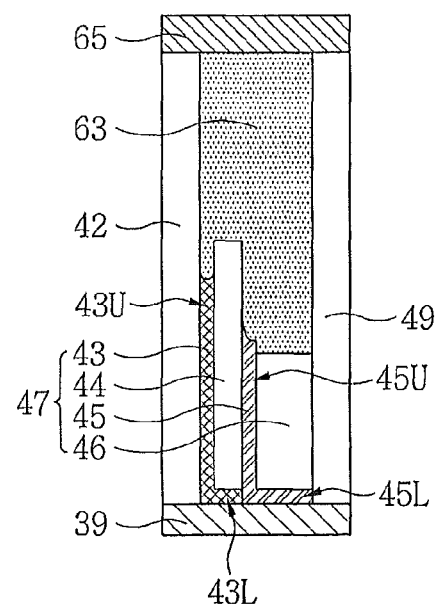

Referring to FIG. 16C, the first upper part 43U may be formed at a lower level than the upper end of the first resistive pattern 44. The data storage pattern 63 may extend between the first resistive pattern 44 and the first insulating pattern 42. The second upper part 45U may protrude at a higher level than the second resistive pattern 46. The second upper part 45U may gradually rise toward the first resistive pattern 44. The second electrode 45 may include a different material from the first electrode 43.

Figure 17A:
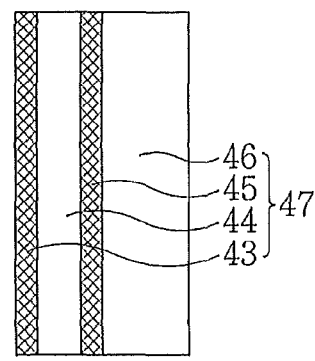

Referring to FIG. 17A, the horizontal width of the first resistive pattern 44 may be greater than that of the first electrode 43 or the second electrode 45. The horizontal width of the second resistive pattern 46 may be greater than that of the first resistive pattern 44.

Figure 17B:
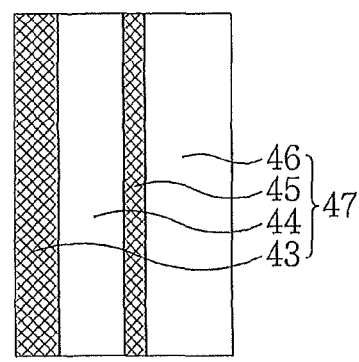

Referring to FIG. 17B, the horizontal width of the first electrode 43 may be greater than that of the second electrode 45. The horizontal width of the first resistive pattern 44 may be greater than that of the first electrode 43 or the second electrode 45. The horizontal width of the second resistive pattern 46 may be greater than that of the first resistive pattern 44.

Figure 17C:
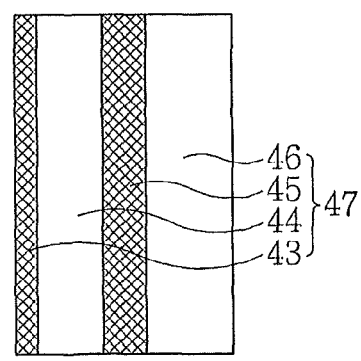

Referring to FIG. 17C, the horizontal width of the second electrode 45 may be greater than that of the first electrode 43. The horizontal width of the first resistive pattern 44 may be greater than that of the first electrode 43 or the second electrode 45. The horizontal width of the second resistive pattern 46 may be greater than that of the first resistive pattern 44.

Figure 17D:
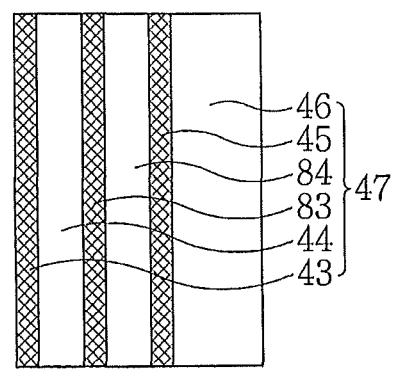

Referring to FIG. 17D, the horizontal width of the first resistive pattern 44 may be greater than that of the first electrode 43, second electrode 45, or third electrode 83. A horizontal width of the third resistive pattern 84 may be the same as that of the first resistive pattern 44. The horizontal width of the second resistive pattern 46 may be greater than that of the third resistive pattern 84.

In another embodiment, the horizontal width of the third resistive pattern 84 may be greater than that of the first resistive pattern 44.

Figure 17E:
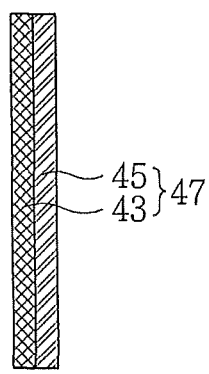

Referring to FIG. 17E, the second electrode 45 may be in contact with the first electrode 43. The second electrode 45 may have a different material from the first electrode 43. The second electrode 45 may have a conductive material having a higher resistivity than the first electrode 43.

FIGS. 18 to 21 are cross-sectional views describing a method of operation of a non-volatile memory device in accordance with some embodiments of the inventive concept.

Referring again to FIG. 1, the data storage pattern 63 may include GeSbTe, GeTeAs, SnTeSn, GeTe, SbTe, SeTeSn, GeTeSe, SbSeBi, GeBiTe, GeTeTi, InSe, GaTeSe, or InSbTe.

The data storage pattern 63 may be a material layer including one selected from a group consisting of a GeSbTe layer, GeTeAs layer, SnTeSn layer, GeTe layer, SbTe layer, SeTeSn layer, GeTeSe layer, SbSeBi layer, GeBiTe layer, GeTeTi layer, InSe layer, GaTeSe layer, and InSbTe layer, and including one selected from a group consisting of C, N, Si, and O. The data storage pattern 63 may be programmed to have one of a first resistance level, a second resistance level having higher electrical resistance than the first resistance level, a third resistance level having higher electrical resistance than the second resistance level, and a fourth resistance level having higher electrical resistance than the third resistance level. The data storage pattern 63 may have the lowest electrical resistance when the data storage pattern 63 is in an all-crystalline state, and the highest electrical resistance when the data storage pattern 63 is in an all-amorphous state.

For example, the first resistance level may be implemented by switching the entire data storage pattern 63 to the crystalline state. The second resistance level may be implemented by switching a first area of the data storage pattern 63 to the amorphous state, and a second area of the data storage pattern 63 to the crystalline state. The first area may have smaller volume than the second area. The third resistance level may be implemented by switching a third area of the data storage pattern 63 to the crystalline state, and a fourth area of the data storage pattern 63 to the amorphous state. The third area may have smaller volume than the fourth area. The fourth resistance level may be implemented by switching the data storage pattern 63 to all-crystalline state.

A set current or reset current may be applied between the lower pad 39 and the upper electrode 65 so as to switch the data storage pattern 63 to the crystalline state or the amorphous state. The word line 25 and the bit line 75 may function to supply the set current or the reset current to the lower pad 39 and the upper electrode 65.

The data storage pattern 63 may be switched to the crystalline state via a molten state by the set current. The set current may include a first set current and a second set current. The first set current may be an amount capable of switching a portion of the data storage pattern 63 to the crystalline state, and the second set current may be larger than the first set current. For example, the second set current may be an amount capable of switching the entire data storage pattern 63 to the crystalline state. A maximum magnitude of the first set current may be less than that of the second set current. The set current may include a quenching waveform with a lower quenching speed compared to that of the reset current, after a current pulse is applied between the lower pad 39 and the upper electrode 65. The quenching waveform of the set current may be reduced until a magnitude of the current reaches a minimum value such as zero over a time period longer than that of the reset current, for example, 500 ns.

The data storage pattern 63 may be switched to the amorphous state via a molten state by the reset current. The reset current may include a first reset current and a second reset current. The first reset current may be an amount capable of switching a portion of the data storage pattern 63 to the amorphous state, and the second reset current may be larger than the first reset current. For example, the second reset current may be an amount capable of switching the entire data storage pattern 63 to the amorphous state. A maximum magnitude of the first reset current may be less than that of the second reset current. The reset current may have a quenching waveform with a higher quenching speed compared to that of the set current, after a current pulse is applied between the lower pad 39 and the upper electrode 65. The waveform of the reset current may be reduced until a magnitude of the current reaches a minimum value such as zero over a time period shorter than that of the set current, for example, 10 ns.

In another embodiment, the second set current may be smaller than the first set current. The second reset current may be smaller than the first reset current.

Figure 18:
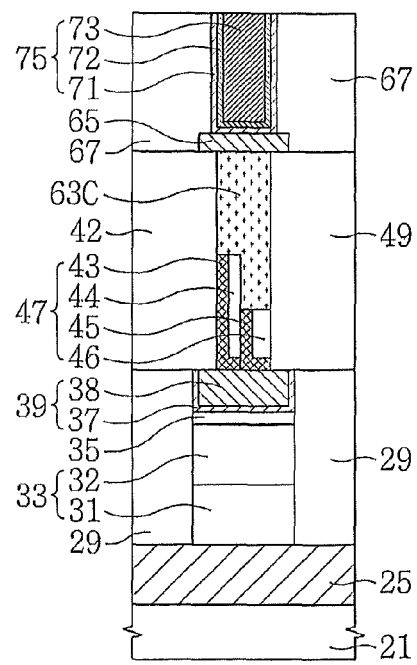
FIGS. 18 to 21 are cross-sectional views illustrating a method of operation of a non-volatile memory device in accordance with some embodiments of the inventive concept.

Referring to FIG. 18, the entire data storage pattern 63C may be switched to the crystalline state by applying the second set current between the lower pad 39 and the upper electrode 65. The second set current may be applied to the data storage pattern 63C via the electrode structure 47. The second set current may flow through the first electrode 43 and the second electrode 45. The data storage pattern 63C in the crystalline state may show the first resistance level. The first resistance level may be represented as "D00".

Figure 19:
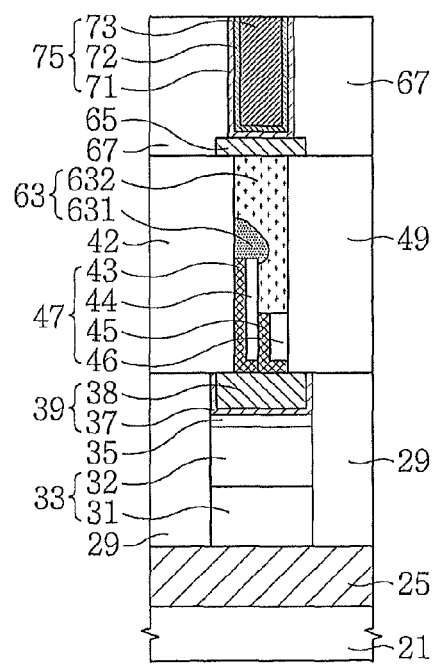

Referring to FIG. 19, a sequential combination of the second set current and the first reset current may be applied between the lower pad 39 and the upper electrode 65. The second set current may be applied between the lower pad 39 and the upper electrode 65 followed by applying the first reset current, to switch the first area 631 of the data storage pattern 63 to the amorphous state and the second area of the data storage pattern 63 to the crystalline state.

The second set current may be applied to the data storage pattern 63 via the electrode structure 47. The second set current may flow through the first electrode 43 and the second electrode 45. The entire data storage pattern 63 may be switched to the crystalline state by the second set current. The first reset current may be applied to the data storage pattern 63 via the electrode structure 47. The first reset current may flow through the first electrode 43 and the second electrode 45. The first reset current may flow through a first path via the data storage pattern 63 and first electrode 43, and a second path via the data storage pattern 63 and second electrode 45, between the lower pad 39 and the upper electrode 65. The electrical resistance of the first path may be lower than that of the second path. The first reset current may intensively flow through the first path. The first area 631 may be switched to the amorphous state by the first reset current. The first area 631 may be a part of the data storage pattern 63 close to the first electrode 43. The second area 632 may be the rest of the data storage pattern 63 excluding the first area 631.

The data storage pattern 63 having the first area 631 in the amorphous state and second area 632 in the crystalline state may show the second resistance level by applying the second set current and the first reset current sequentially to the first electrode 43 and the second electrode 45. The second resistance level may be represented as "D01".

Figure 20:
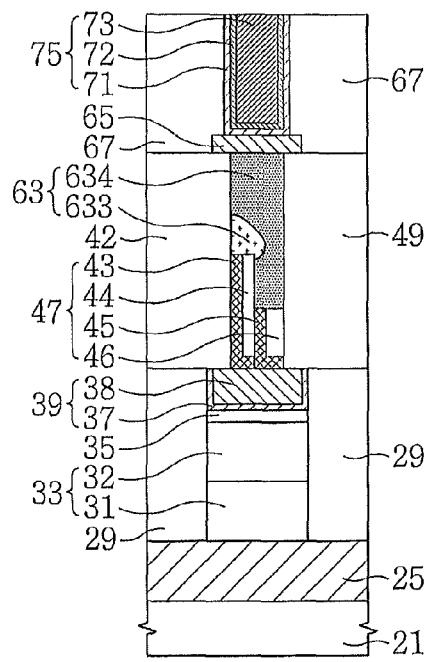

Referring to FIG. 20, a sequential combination of the second reset current and the first set current may be applied between the lower pad 39 and the upper electrode 65. The second reset current may be applied between the lower pad 39 and the upper electrode 65 followed by applying the first set current, to switch the third area 633 of the data storage pattern 63 to the crystalline state and the fourth area of the data storage pattern 63 to the amorphous state.

The second reset current may be applied to the data storage pattern 63 via the electrode structure 47. The second reset current may flow through the first electrode 43 and the second electrode 45. The entire data storage pattern 63 may be switched to the amorphous state by the second reset current. The first set current may be applied to the data storage pattern 63 via the electrode structure 47. The first set current may flow through the first electrode 43 and the second electrode 45. The first set current may flow through a first path via the data storage pattern 63 and first electrode 43, and a second path via the data storage pattern 63 and second electrode 45, between the lower pad 39 and the upper electrode 65. The electrical resistance of the first path may be lower than that of the second path. The first set current may intensively flow through the first path. The third area 633 may be switched to the crystalline state by the first set current. The third area 633 may be a part of the data storage pattern 63 close to the first electrode 43. The fourth area 632 may be the rest of the data storage pattern 63 excluding the third area 633.

The data storage pattern 63 having the third area 633 in the crystalline state and fourth area 634 in the amorphous state may show the third resistance level. The third resistance level may be represented as "D10".

The third area 633 may overlap the first area 631, and the fourth area 634 may overlap the second area 632.

Figure 21:
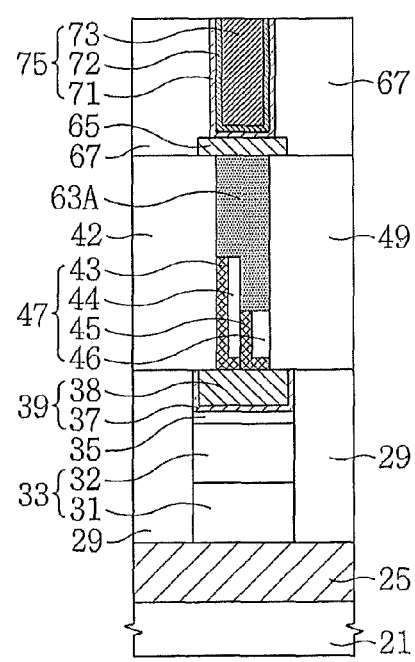

Referring to FIG. 21, the entire data storage pattern 63A may be switched to the amorphous state by applying the second reset current between the lower pad 39 and the upper electrode 65. The second reset current may be applied to the data storage pattern 63A via the electrode structure 47. The second reset current may flow through the first electrode 43 and the second electrode 45. The data storage pattern 63A in the amorphous state may show the fourth resistance level. The fourth resistance level may be represented as "D11".

In some conventional multi-level cell programming methods use one reset current and three different levels of set currents but, as appreciated by the present inventors, those methods may not make the data storage pattern have four distinct resistance levels. As described above, according to the embodiments of the inventive concept, the data storage pattern 63 may be programmed to have the first resistance level, the second resistance level, the third resistance level, or the fourth resistance level. Due to the configuration consisting of the first area 631 in the amorphous state and the second area 632 in the crystalline state, the second resistance level may show a significant difference from the first resistance level and third resistance level. The second resistance level may show remarkably higher electrical resistance than the first resistance level, and remarkably lower electrical resistance than the third resistance level.

Due to the configuration consisting of the third area 633 in the crystalline state and fourth area 634 in the amorphous state, the third resistance level may show a significant difference from the second resistance level and fourth resistance level. The third resistance level may show remarkably higher electrical resistance than the second resistance level, and remarkably lower electrical resistance than the fourth resistance level.

The first to fourth resistance levels may show a significant difference from each other, due to programming of the data storage pattern 63 to have the second resistance level by applying the second set current followed by applying the first reset current, and programming of the data storage pattern 63 to have the third resistance level by applying the second reset current followed by applying the first set current. The first to fourth resistance levels may be clearly distinguished from each other.

FIGS. 22 to 35 are cross-sectional views taken along lines I-I' and II-II' of FIG. 3 describing a fabrication method of a non-volatile memory device in accordance with embodiments of the inventive concept. The layout and the cross-sectional views illustrated in FIG. 3 and FIGS. 22 to 35 may correspond to a cell region of the phase change memory device.

Figure 22:
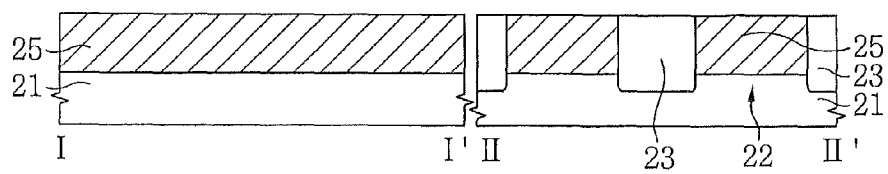
FIGS. 22 to 35 are cross-sectional views taken along lines I-I' and II-II' of FIG. 3 illustrating a fabrication method of a non-volatile memory device in accordance with some embodiments of the inventive concept.

Referring to FIG. 3 and FIG. 22, an isolation layer 23 defining active regions 22 may be formed in a predetermined area of a substrate 21. Word lines 25 may be formed in the active regions 22. The word lines 25 may be parallel to each other. The isolation layer 23 may be formed between the word lines 25.

The substrate 21 may be a semiconductor substrate such as single crystalline silicon wafer or silicon on insulator (SOI). In the following, it is assumed and described that the substrate 21 is a silicon wafer containing p-type impurity ions. The isolation layer 23 may include silicon oxide, silicon nitride, silicon oxy-nitride, or a combination thereof. The word lines 25 may be formed by applying n-type impurity ions to the active regions 22.

In some embodiments, the word lines 25 may be conductive lines formed on the substrate 21. For example, the word lines 25 may be a semiconductor layer formed using selective epitaxial growth (SEG) technology or solid phase epitaxial growth technology. The word lines 25 may be formed to have a vertical height greater than the horizontal width. In another embodiment, the word lines 25 may include a conductive layer such as a metal layer, a metal silicide layer, a conductive carbon layer, or a combination thereof.

Figure 23:
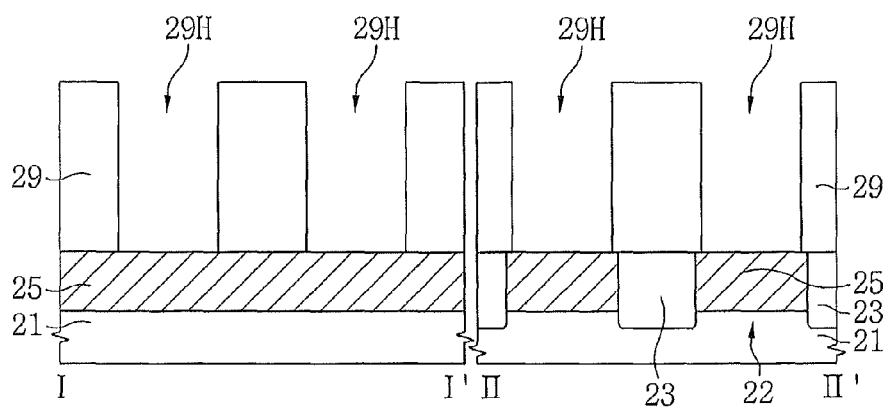

Referring to FIG. 3 and FIG. 23, a molding layer 29 may be formed on the substrate 21 having the word lines 25. Contact holes 29H passing through the molding layer 29 and exposing the word lines 25 may be formed. The contact holes 29H may be aligned along the word lines 25 at regular intervals. The contact holes 29H may be spaced apart from each other. Each of the contact holes 29H may have an aspect ratio greater than 10:1.

The molding layer 29 may include silicon oxide, silicon nitride, silicon oxy-nitride, or a combination thereof. For example, the molding layer 29 may include silicon oxide. The molding layer 29 may cover the word lines 25 and the isolation layer 23. Although an etch stopping layer may be formed between the word lines 25 and the molding layer 29, the etch stopping layer will be omitted for brevity. The contact holes 29H may be formed by a patterning technology. For example, a photolithography process and an anisotropic etching process may be used for the formation of the contact holes 29H. Each of the contact holes 29H may be formed to have various shapes such as a circle, a rectangle, or a rectangle with rounded corners. Each of the contact holes 2911 may be narrower than the word lines 25.

Figure 24:
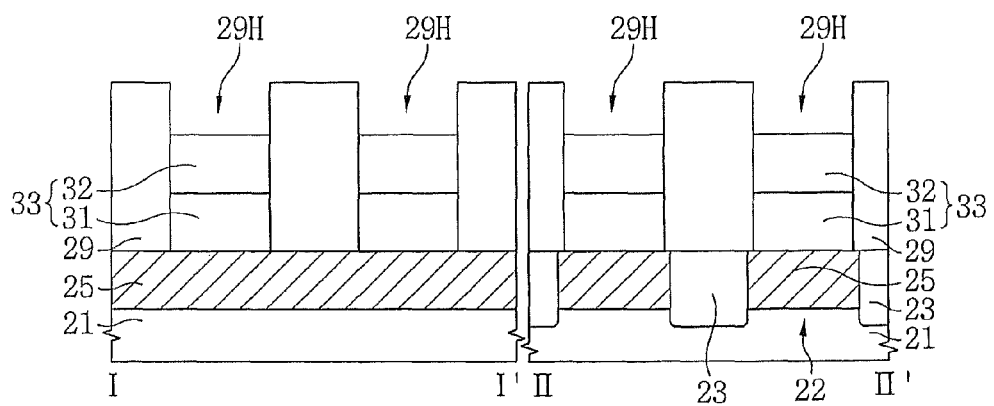

Referring to FIG. 3 and FIG. 24, a first semiconductor pattern 31 and a second semiconductor pattern 32 may be sequentially formed inside each contact hole 29H. The first and second semiconductor patterns 31 and 32 may configure a diode 33. The diode 33 may function as a switching device.

The first and second semiconductor patterns 31 and 32 may be formed using SEG technology. The first semiconductor pattern 31 may be formed between the second semiconductor pattern 32 and the word lines 25. For example, the first semiconductor pattern 31 may include a silicon layer containing n-type impurity ions. The second semiconductor pattern 32 may include a silicon layer containing p-type impurity ions.

In some embodiments, the first semiconductor pattern 31 may be omitted. In another embodiment, the first and second semiconductor patterns 31 and 32 may be formed by changing the stacking sequence.

Figure 25:
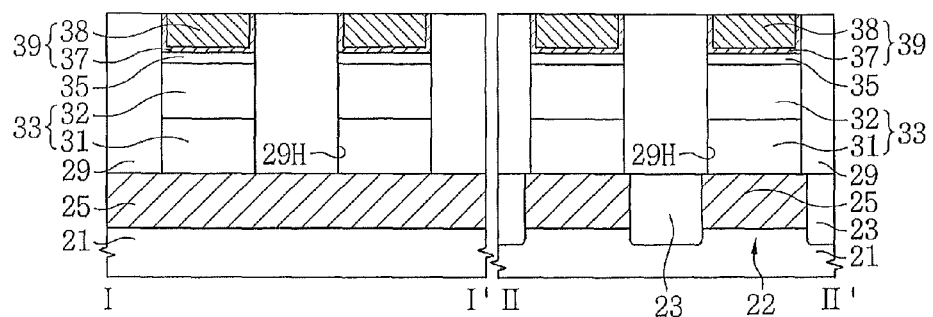

Referring to FIG. 3 and FIG. 25, a metal silicide layer 35 may be formed on the diode 33. A first barrier metal pattern 37 and a conductive pattern 38 may be sequentially formed on the metal silicide pattern 35. The first barrier metal pattern 37 and the conductive pattern 38 may comprise a lower pad 39.

The metal silicide pattern 35 may be in contact with the second semiconductor pattern 32. The first barrier metal pattern 37 and the conductive pattern 38 may be formed using a thin film formation process and a planarization process. An upper surface of the lower pad 39 may be formed at the same level as an upper surface of the molding layer 29. The first barrier metal pattern 37 may surround the side and bottom of the conductive pattern 38. The first barrier metal pattern 37 may be in contact with the metal silicide pattern 35.

The metal silicide pattern 35 may include CoSi, NiSi, WSi, TiSi, or TaSi. For example, the metal silicide pattern 35 may be formed of a CoSi layer. The first barrier metal pattern 37 may include Ti, TiN, TiAlN, TiCN, TiSiN, TiON, Ta, TaN, TaAlN, TaCN, TaSiN, C, CN, CoSi, CoSiN, WN, WSi, WSiN, or a combination thereof. The conductive pattern 38 may include Ti, TiN, TiAlN, TiCN, TiSiN, TiON, Ta, TaN, TaAlN, TaCN, TaSiN, C, CN, CoSi, CoSiN, W, WN, WSi, WSiN, Ni, or a combination thereof. For example, the first barrier metal pattern 37 may be a Ti/TiN layer, and the conductive pattern 38 may be a W layer.

The metal silicide pattern 35 and the lower pad 39 may be referred to as a diode electrode or a first conductive pattern. The metal silicide pattern 35 and the lower pad 39 may be selectively omitted. When the metal silicide pattern 35 and the lower pad 39 are omitted, the word lines 25 may be referred to as a first conductive pattern.

Figure 26:
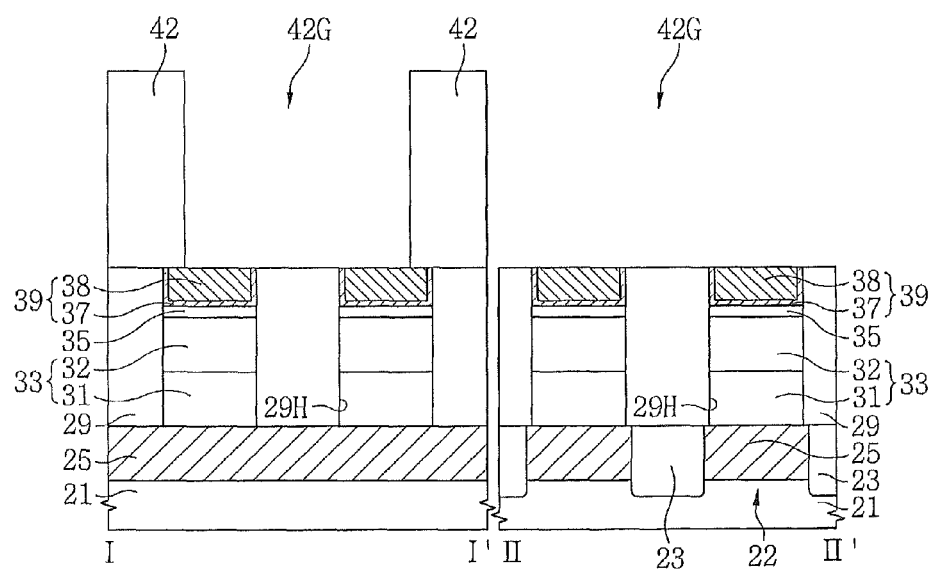

Referring to FIG. 3 and FIG. 26, first insulating patterns 42 having first grooves 42G may be formed on the molding layer 29. The first insulating patterns 42 may partially cover the lower pads 39. The lower pads 39 and the molding layer 29 may be exposed on a bottom of the first groove 42G. A sidewall of the first groove 42G may be formed to cross the lower pads 39. The first insulating patterns 42 may be formed using a thin film formation process and a patterning process. The first insulating patterns 42 may include silicon oxide, silicon nitride, silicon oxy-nitride, or a combination thereof. For example, the first insulating pattern 42 may be silicon nitride.

Figure 27:
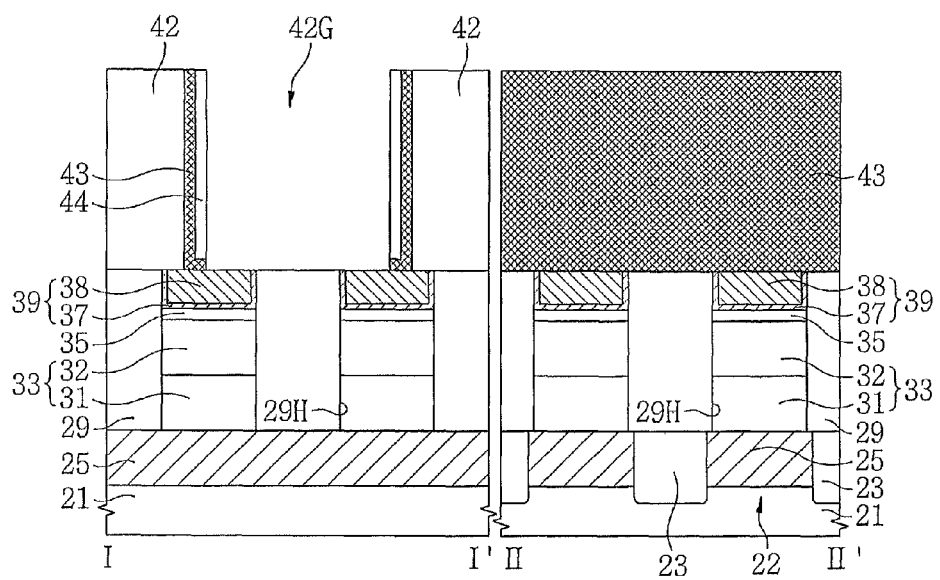

Referring to FIG. 3 and FIG. 27, a first electrode 43 and a first resistive pattern 44 may be formed on a sidewall of the first groove 42G. The first electrode 43 and a first resistive pattern 44 may be formed by a thin-film formation process and an anisotropic etching process. The first electrode 43 may be in contact with the lower pads 39. The first electrode 43 may be formed between the first resistive pattern 44 and the first insulating pattern 42, and the first electrode may extend between the first resistive pattern 44 and the lower pads 39. The first electrode 43 may have an L-shape. The first resistive pattern 44 may be in contact with a side of the first electrode 43.

The first electrode 43 may include Ti, TiN, TiAlN, TiCN, TiSiN, TiON, Ta, TaN, TaAlN, TaCN, TaSiN, C, CN, CoSi, CoSiN, W, WN, WSi, WSiN, Ni, or a combination thereof. The first resistive pattern 44 may include a material different from the first electrode 43. The first resistive pattern 44 may include a material having a higher resistivity than the first electrode 43. The first resistive pattern 44 may include an insulating material. The first resistive pattern 44 may include a material having etching selectivity with respect to the first insulating patterns 42. The first resistive pattern 44 may include polysilicon, silicon oxide, silicon nitride, silicon oxy-nitride, or a combination thereof. For example, the first resistive pattern 44 may include silicon oxide.

Figure 28:
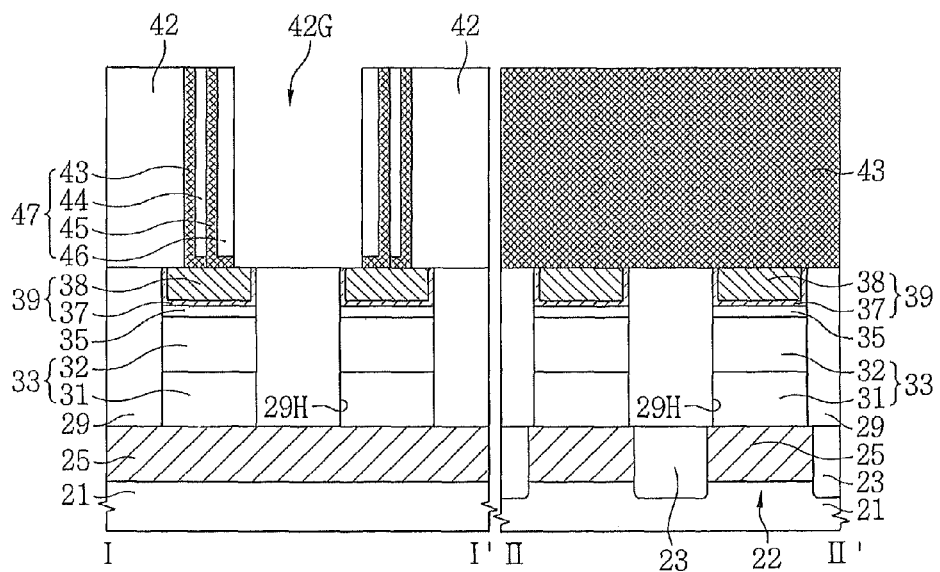

Referring to FIG. 3 and FIG. 28, a second electrode 45 and a second resistive pattern 46 may be formed on the sidewall of the first groove 42G having the first electrode 43 and the first resistive pattern 44. The first electrode 43, the first resistive pattern 44, the second electrode 45, and the second resistive pattern 46 may configure an electrode structure 47. The second electrode 45 and the second resistive pattern 46 may be formed by a thin film formation process and an anisotropic etching process. The second electrode 45 may be in contact with the lower pads 39. The second electrode 45 may be formed between the first resistive pattern 44 and the second resistive pattern 46, and the second electrode 45 may extend between the second resistive pattern 46 and the lower pads 39. The second electrode 45 may have an L-shape. The second resistive pattern 46 may be in contact with a side of the second electrode 45. The second electrode 45 may be in contact with the first electrode 43.

The second electrode 45 may include Ti, TiN, TiAlN, TiCN, TiSiN, TiON, Ta, TaN, TaAlN, TaCN, TaSiN, C, CN, CoSi, CoSiN, W, WN, WSi, WSiN, Ni, or a combination thereof. The second electrode 45 may include a different material from the first electrode 43. The second electrode 45 may include a material having a different resistivity from the first electrode 43. The second electrode 45 may include a material having etching selectivity with respect to the first electrode 43.

The second resistive pattern 46 may include a different material from the second electrode 45. The second resistive pattern 46 may include a different material from the first resistive pattern 44. The second resistive pattern 46 may include a material having a higher resistivity than the second electrode 45. The second resistive pattern 46 may include an insulating material. The second resistive pattern 46 may include a material having etching selectivity with respect to the first insulating pattern 42. The second resistive pattern 46 may include a material having etching selectivity with respect to the first resistive pattern 44. The second resistive pattern 46 may include polysilicon, silicon oxide, silicon nitride, silicon oxy-nitride, or a combination thereof. For example, the first resistive pattern 44 may include silicon oxide, and the second resistive pattern 46 may include polysilicon.

Horizontal widths of the first electrode 43, first resistive pattern 44, second electrode 45, and second resistive pattern 46 may be determined by controlling deposition thicknesses in the thin film formation processes. Each of the first electrode 43, first resistive pattern 44, second electrode 45, and second resistive pattern 46 may be formed to have various horizontal widths.

Figure 29:
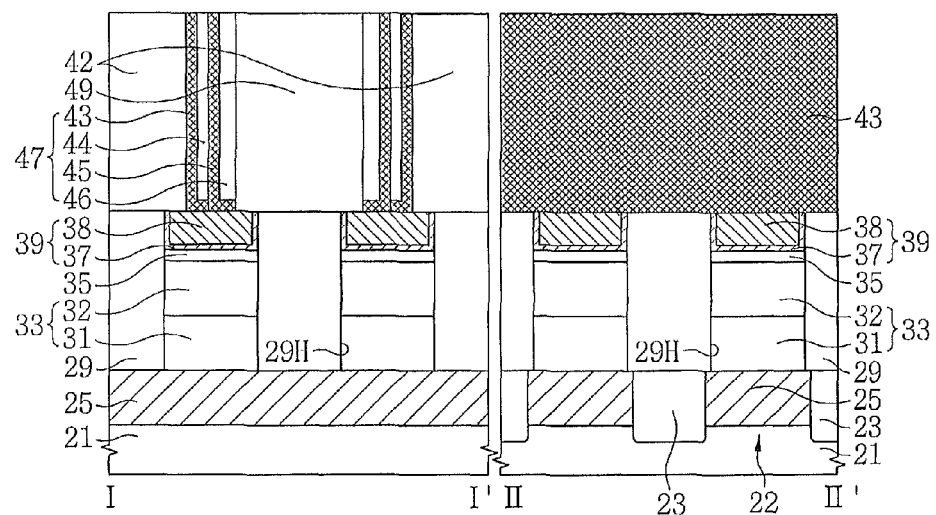

Referring to FIG. 3 and FIG. 29, second insulating patterns 49 may be formed to fill the first grooves 42G. The second insulating patterns 49 may be formed by a thin film formation process and a planarization process. The second insulating patterns 49 may include silicon oxide, silicon nitride, silicon oxy-nitride, or a combination thereof. For example, the second insulating patterns 49 may include silicon nitride. Upper surfaces of the second insulating patterns 49, first electrode 43, first resistive pattern 44, second electrode 45, second resistive pattern 46, and first insulating pattern may be exposed on the same plane. As described above, the first electrode 43, the first resistive pattern 44, the second electrode 45, and the second resistive pattern 46 may configure an electrode structure 47. Upper surfaces of the second insulating patterns 49, electrode structure 47, and first insulating patterns 42 may be exposed on the same plane.

Figure 30:
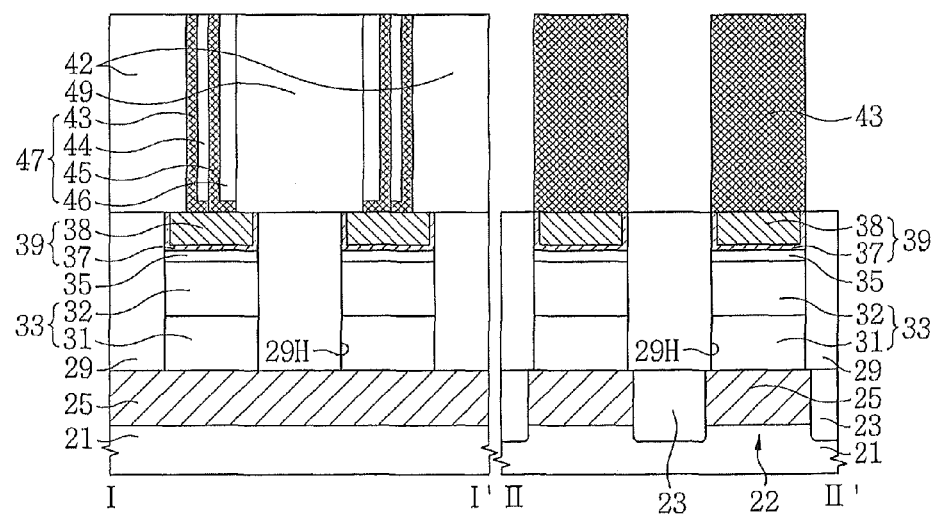

Referring to FIG. 3 and FIG. 30, the second insulating patterns 49, the electrode structure 47, and the first insulating patterns 42 may be patterned to be separated into fractions. For example, a plurality of the second insulating patterns 49, a plurality of the electrode structures 47, and a plurality of the first insulating patterns 42 may be formed. The molding layer 29 may be exposed between the electrode structures 47. The electrode structures 47 may remain on the lower pads 39.

Figure 31:
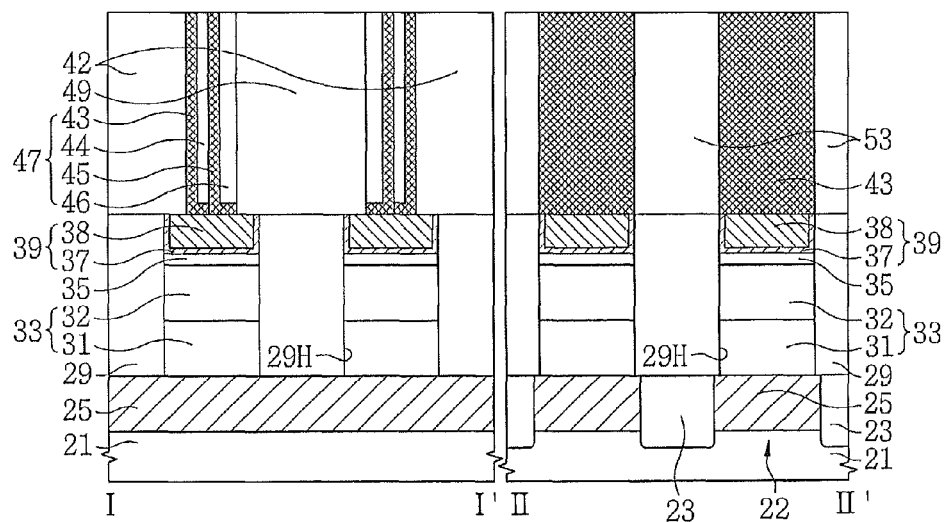

Referring to FIG. 3 and FIG. 31, insulating lines 53 may be formed on the exposed molding layer 29. The insulating lines 53 may be formed by a thin film formation process and a planarization process. The insulating lines 53 may include silicon oxide, silicon nitride, silicon oxy-nitride, or a combination thereof. For example, the insulating lines 53 may include silicon nitride. The insulating lines 53 may fill spaces between the electrode structures 47. Upper surfaces of the insulating lines 53, second insulating patterns 49, electrode structures 47, and first insulating patterns 42 may be exposed on the same plane.

The insulating lines 53 may be parallel to each other. One selected from the second insulating patterns 49 and corresponding one of the first insulating patterns 42 may be formed to face each other between the insulating lines 53. One of the electrode structures 47 may be formed between the one selected from the second insulating patterns 49 and the corresponding one of the first insulating patterns 42. The electrode structures 47 may have a dash-shape in the plan view of FIG. 3.

Figure 32:
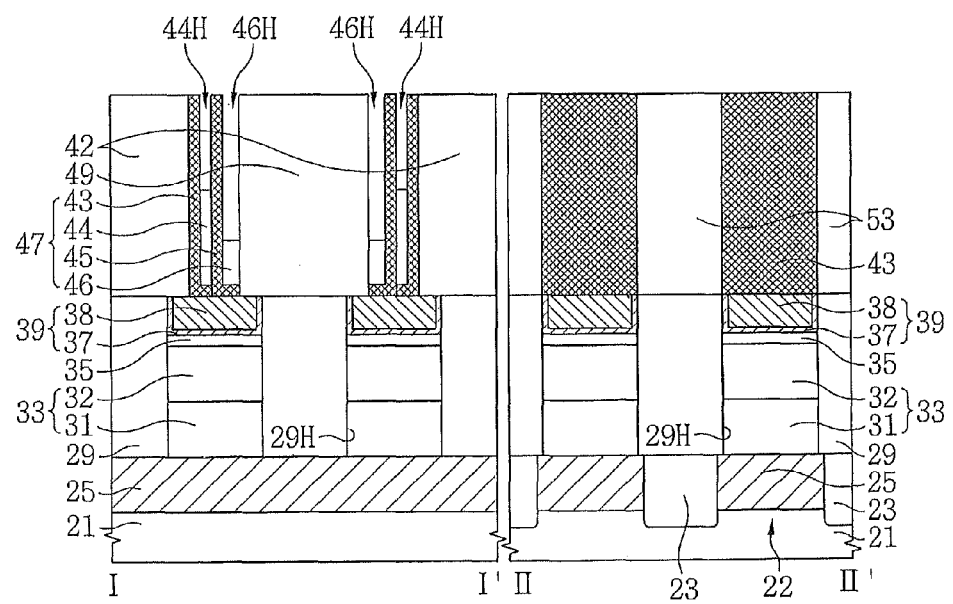

Referring to FIG. 3 and FIG. 32, first trenches 44H and second trenches 46H may be formed by partially recessing the first resistive pattern 44 and the second resistive pattern 46. A wet etchback process and/or a dry etchback process may be applied for the recess of the resistive pattern 46. The first resistive pattern 44 may remain on bottoms of the first trenches 44H, and the second resistive pattern 46 may remain on bottoms of the second trenches 46H. The second resistive pattern 46 may remain at a lower level than an upper end of the first resistive pattern 44.

Figure 33:
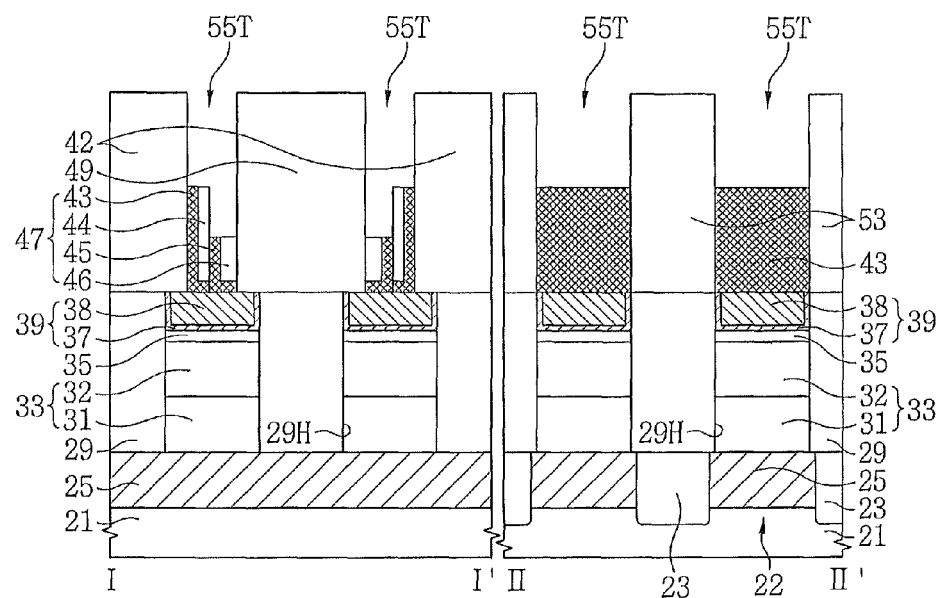

Referring to FIG. 3 and FIG. 33, the first electrode 43 and the second electrode 45 may be partially recessed to form third trenches 55T connected to the first and second trenches 44H and 46H. A wet etchback process and/or a dry etchback process may be applied for the recessing of the first and second electrodes 43 and 45. The electrode structures 47 may remain on bottoms of the third trenches 55T. The second electrode 45 may be formed at a lower level than an upper end of the first electrode 43.

Figure 34:
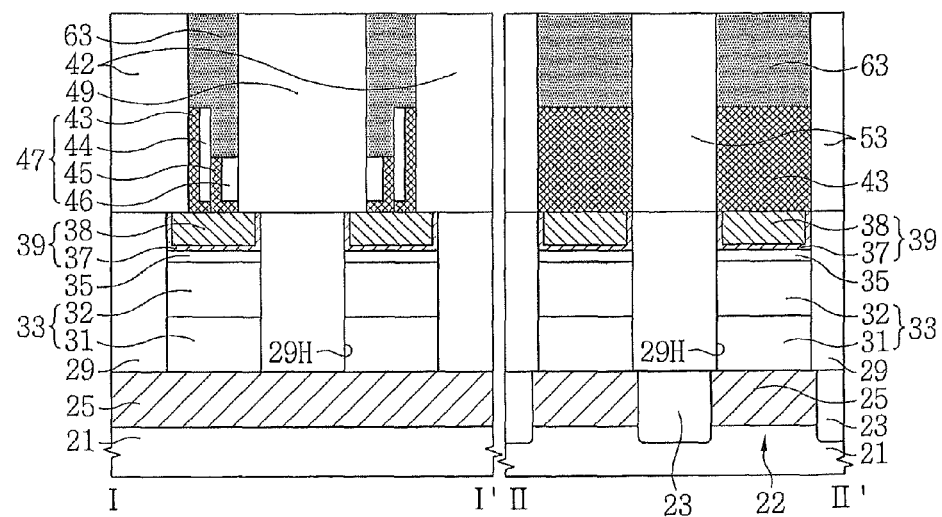

Referring to FIG. 3 and FIG. 34, data storage patterns 63 may be formed to fill the third trenches 55T. The data storage patterns 63 may be formed using a thin film formation process and a planarization process. The data storage patterns 63 may be self-aligned to the electrode structures 47. Sides of the data storage patterns 63 may be vertically aligned with sides of the electrode structures 47. The data storage patterns 63 may be in contact with the first and second electrodes 43 and 45. The data storage patterns 63, which are directly adjacent each other, have a symmetrical shape relative to each other about an axis extending between the storage patterns.

Each of the data storage patterns 63 may include a phase-change plug. For example, each of the data storage patterns 63 may include GeSbTe, GeTeAs, SnTeSn, GeTe, SbTe, SeTeSn, GeTeSe, SbSeBi, GeBiTe, GeTeTi, InSe, GaTeSe, or InSbTe. Each of the data storage patterns 63 may be a material layer including one selected from a group consisting of a GeSbTe layer, GeTeAs layer, SnTeSn layer, GeTe layer, SbTe layer, SeTeSn layer, GeTeSe layer, SbSeBi layer, GeBiTe layer, GeTeTi layer, InSe layer, GaTeSe layer, and InSbTe layer, and including one selected from a group consisting of C, N, Si, and O. Each of the data storage patterns 63 may be formed by stacking a different material from each other.

In another embodiment, each of the data storage patterns 63 may include a polymer plug, a nanoparticle plug, or a variable resistance plug. For example, the variable resistance plug may include a $SrTiO_3$ layer.

Figure 35:
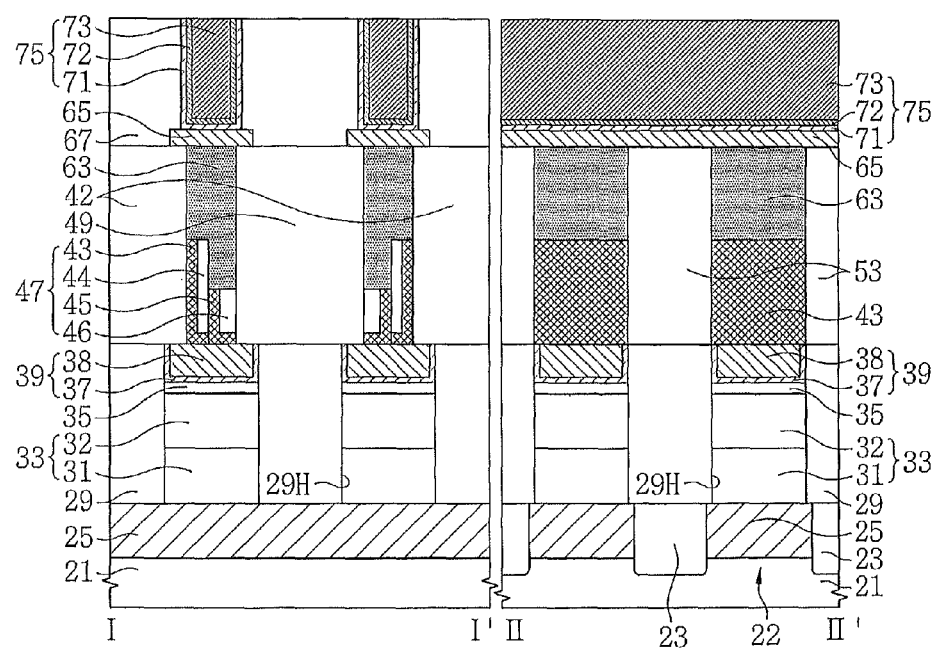

Referring to FIG. 3 and FIG. 35, upper electrodes 65 in contact with the data storage patterns 63 may be formed on the first insulating patterns 42, the second insulating patterns 49, and the insulating lines 53. An upper insulating layer 67 may be formed on the first insulating patterns 42, the second insulating patterns 49, the insulating lines 53, and the upper electrodes 65. Bit lines 75 in contact with the upper electrodes 65 through the upper insulating layer 67 may be formed. Each of the bit lines 75 may include a sequentially stacked second barrier metal pattern 71, seed layer 72, and bit conductive layer 73. The upper electrodes 65 may be omitted. The upper electrodes 65 and/or the bit lines 75 may be referred to as a second conductive pattern.

The upper electrodes 65 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, or a combination thereof. The upper insulating layer 67 may include silicon oxide, silicon nitride, or silicon oxynitride. The second barrier metal pattern 71 may include Ti, TiN, or Ti/TiN. The seed layer 72 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, Al, Cu, or a combination thereof. The bit conductive layer 73 may include Ti, TiN, or Ti/TiN. The seed layer 72 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, Al, Cu, or a combination thereof. For example, the bit conductive layer 73 may include Cu layer formed by an electroplating method.

Figure 36:
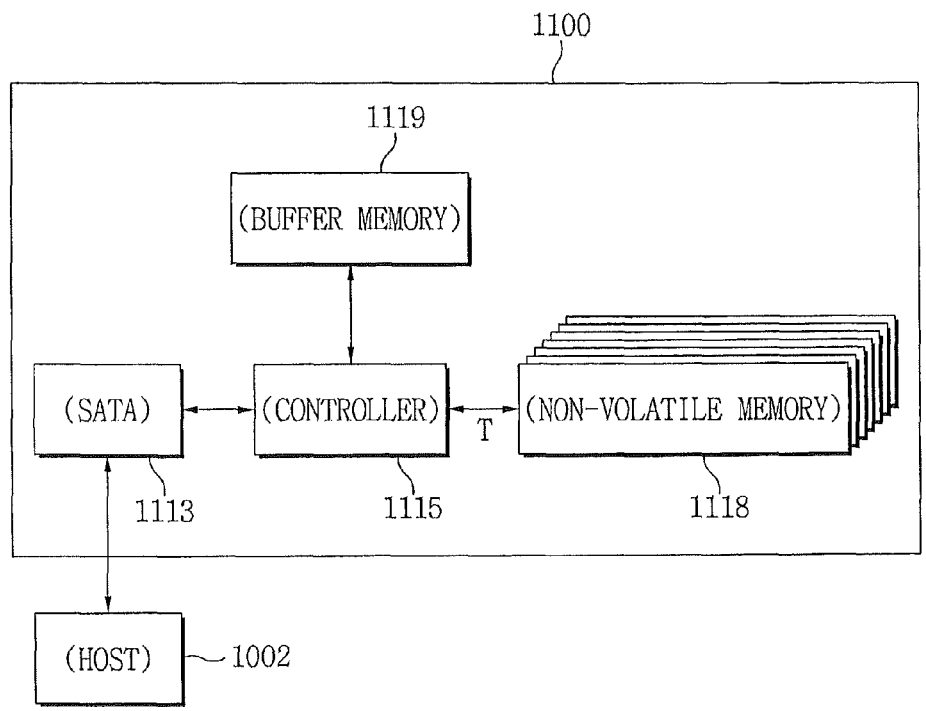
FIG. 36 is a system block diagram illustrating an example of an electronic apparatus including a non-volatile memory device in accordance with some embodiments of the inventive concept.

FIG. 36 is a system block diagram illustrating an example of an electronic apparatus including a non-volatile memory device in accordance with some embodiments of the inventive concept. The electronic apparatus may be a data storage device such as a solid state disk (SSD) 1100.

Referring to FIG. 36, the SSD 1100 may include an interface 1113, a controller 1115, a non-volatile memory 1118, and a buffer memory 1119. The SSD 1100 is an apparatus which stores information using a semiconductor device. The SSD 1100 is faster, has a lower mechanical delay or failure rate, and generates less heat and noise than a hard disk drive (HDD). Further, the SSD 1100 may be smaller and lighter than the HDD. The SSD 1100 may be used in a laptop computer, a desktop PC, an MP3 player, or a portable storage device.

The controller 1115 may be formed close to the interface 1113 and electrically connected thereto. The controller 1115 may be a microprocessor including a memory controller and a buffer controller. The non-volatile memory 1118 may be formed close to the controller 1115 and electrically connected thereto. Data storage capacity of the SSD 1100 may correspond to a capacity of the non-volatile memory 1118. The buffer memory 1119 may be formed close to the controller 1115 and electrically connected thereto.

The interface 1113 may be connected to a host 1002, and may send and receive electrical signals such as data. For example, the interface 1113 may be a device using a standard such as a Serial Advanced Technology Attachment (SATA), an Integrated Drive Electronics (IDE), a Small Computer System Interface (SCSI), and/or a combination thereof. The non-volatile memory 1118 may be connected to the interface 1113 via the controller 1115. The non-volatile memory 1118 may function to store data received through the interface 1113. Even when power supplied to the SSD 1100 is interrupted, the data stored in the non-volatile memory 1118 may be retained.

The buffer memory 1119 may include a volatile memory. The volatile memory may be a Dynamic Random Access Memory (DRAM) and/or a Static Random Access Memory (SRAM). The buffer memory 1119 has a relatively faster operating speed than the non-volatile memory 1118

Data processing speed of the interface 1113 may be relatively faster than the operating speed of the non-volatile memory 1118. Here, the buffer memory 1119 may function to temporarily store data. The data received through the interface 1113 may be temporarily stored in the buffer memory 1119 via the controller 1115, and then permanently stored in the non-volatile memory 1118 according to the data write speed of the non-volatile memory 1118. Further, frequently-used items of the data stored in the non-volatile memory 1118 may be pre-read and temporarily stored in the buffer memory 1119. That is, the buffer memory 1119 may function to increase effective operating speed of the SSD 1100, and reduce error rate.

The non-volatile memory 1118 may include a non-volatile memory device as described with reference to FIGS. 1 to 35. For example, the non-volatile memory 1118 may include a memory cell having a configuration similar to FIG. 1. The non-volatile memory 1118, due to the configuration consisting of the first electrode 43 and the second electrode 45, may have superior electrical characteristics to the related art. Therefore the electrical characteristics of the SSD may be significantly improved compared to the related art.

Figure 37:
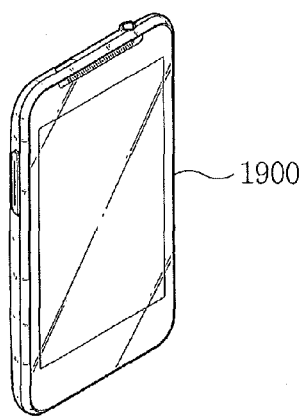
FIGS. 37 and 38 are a perspective view and a system block diagram, respectively, illustrating an example of an electronic apparatus including a non-volatile memory device in accordance with some embodiments of the inventive concept.
Figure 38:
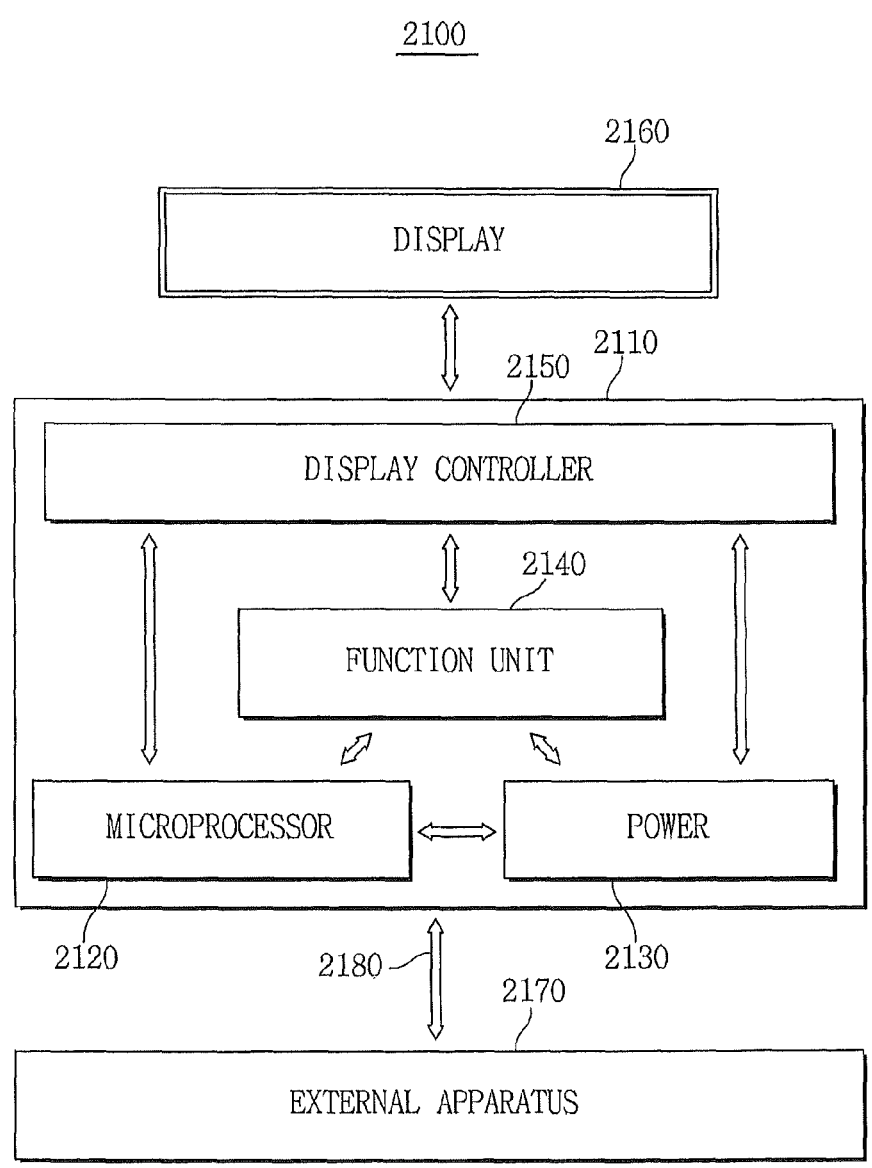

FIGS. 37 and 38 are a perspective view and a system block diagram, respectively, illustrating an example of an electronic apparatus including a non-volatile memory device in accordance with some embodiments of the inventive concept.

Referring to FIG. 37, the non-volatile memory device may be usefully applied to electronic apparatus such as a mobile phone 1900, a net book, a laptop computer, or a tablet PC. For example, the non-volatile memory device as described with reference to FIGS. 1 to 35 may be installed in a main board in the mobile phone 1900. Further, the non-volatile memory device as described with reference to FIGS. 1 to 35 may be provided to an expansion apparatus such as an external memory card, to be used combined with the mobile phone 1900.

Referring to FIG. 38, the non-volatile memory device as described with reference to FIGS. 1 to 35 may be applied to an electronic system 2100. The electronic system 2100 may include a body 2110, a microprocessor unit 2120, a power unit 2130, a function unit 2140, and a display controller unit 2150. The body 2110 may be a mother board formed of a printed circuit board (PCB). The microprocessor unit 2120, the power unit 2130, the function unit 2140, and the display controller unit 2150 may be installed on the body 2110. A display unit 2160 may be installed inside or outside of the body 2110. For example, the display unit 2160 may be disposed on a surface of the body 2110 to display an image processed by the display controller unit 2150.

The power unit 2130 may function to receive a constant voltage from an external battery, divide the voltage into required levels, and supply those voltages to the microprocessor unit 2120, the function unit 2140, and the display controller unit 2150. The microprocessor unit 2120 may receive the voltage from the power unit 2130 to control the function unit 2140 and the display unit 2160. The function unit 2140 may perform functions of various electronic systems 2100. For example, if the electronic system 2100 is a cellular phone, the function unit 2140 may have several components which can perform functions of a cellular phone such as dialing, video output to the display unit 2160 through communication with the external apparatus 2170, and sound output to a speaker, and if a camera is installed, the function unit 2140 may function as a camera image processor.

In the embodiment to which the inventive concept is applied, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. Further, when the electronic system 2100 needs a universal serial bus (USB) in order to expand functionality, the function unit 2140 may function as an interface controller. In addition, the function unit 2140 may include a mass storage device.

The non-volatile memory device as herein described with reference to FIG. 1 to FIG. 35 may be applied to the function unit 2140. For example, the function unit 2140 may include the first electrode 43, the second electrode 45, and the data storage pattern 63. The data storage pattern 63 may be electrically connected to the body 2110.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A non-volatile memory device, comprising:
   a first conductive pattern on a substrate;
   an electrode structure on the first conductive pattern;
   a data storage pattern on the electrode structure; and
   a second conductive pattern on the data storage pattern,
   wherein the electrode structure comprises:
   a first electrode electrically connected to the first conductive pattern and in contact with the data storage pattern; and
   a second electrode electrically connected to the first conductive pattern and in contact with the data storage pattern, the second electrode having a smaller vertical height than the first electrode, wherein a distance between the second conductive pattern and the first electrode is less than a distance between the second conductive pattern and the second electrode.

2. The non-volatile memory device according to claim 1, wherein the data storage pattern is self aligned on the electrode structure.

3. The non-volatile memory device according to claim 2, wherein a side of the data storage pattern is vertically aligned with a side of the electrode structure.

4. The non-volatile memory device according to claim 1, wherein an upper end of the first electrode is at a higher level than an upper end of the second electrode.

5. The non-volatile memory device according to claim 1, wherein:
   the electrode structure further comprises a first resistive pattern and a second resistive pattern;
   the first electrode comprises a first upper part having a vertical height greater than a horizontal width and a first lower part having a horizontal width greater than a vertical height;
   the second electrode comprises a second upper part having a vertical height greater than a horizontal width and a second lower part having a horizontal width greater than a vertical height;
   the first resistive pattern contacts a side surface of the first upper part and a top surface of the first lower part; and
   the second resistive pattern contacts a side surface of the second upper part and a top surface of the second lower part.

6. The non-volatile memory device according to claim 5, wherein each of the first and second electrodes has an L-shape.

7. The non-volatile memory device according to claim 5, wherein:

the data storage pattern is formed in a single body and includes a lower part and an upper part having a horizontal width greater than a horizontal width of the lower part;

the lower part contacts upper ends of the second electrode and second resistive pattern and a side of the first resistive pattern; and the upper part contacts upper ends of the first electrode and first resistive pattern.

8. The non-volatile memory device according to claim 5, wherein:

a horizontal width of the first resistive pattern is greater than the horizontal width of the first upper part; and a horizontal width of the second resistive pattern is greater than the horizontal width of the second upper part.

9. The non-volatile memory device according to claim 5, wherein a horizontal width of the second resistive pattern is greater than a horizontal width of the first resistive pattern.

10. The non-volatile memory device according to claim 5, wherein the first and second resistive patterns comprise a material having a greater resistivity than the first and second electrodes.

11. The non-volatile memory device according to claim 5, wherein the first resistive pattern and the second resistive pattern comprise insulating materials.

12. The non-volatile memory device according to claim 5, wherein the second resistive pattern includes a different material from the first resistive pattern.

13. The non-volatile memory device according to claim 1, wherein the second electrode has a horizontal width different from a horizontal width of the first electrode.

14. The non-volatile memory device according to claim 1, wherein the second electrode includes a material having a resistivity different from a resistivity of the first electrode.

15. A non-volatile memory device, comprising:
a first conductive pattern on a substrate;
a data storage pattern on the first conductive pattern;
an electrode structure between the first conductive pattern and the data storage pattern; and
a second conductive pattern on the data storage pattern,
wherein the electrode structure comprises:
a first electrode electrically connected to the first conductive pattern, the first electrode contacting the data storage pattern; and
a second electrode electrically connected to the first conductive pattern, the second electrode contacting the data storage pattern and having a smaller vertical height than the first electrode.

16. The non-volatile memory device of claim 15, wherein a lower surface of the first electrode and a lower surface of the second electrode are at an equal level relative to the substrate.

17. The non-volatile memory device of claim 16, wherein the lower surfaces of the first and second electrodes contact an upper surface of the first conductive pattern.

18. The non-volatile memory device of claim 16, wherein a first portion of the data storage pattern between the first electrode and the second conductive pattern has a first thickness, and wherein a second portion of the data storage pattern between the second electrode and the second conductive pattern has a second thickness that is greater than the first thickness.

19. The non-volatile memory device of claim 15, further comprising a resistive pattern between sides of the first and second electrodes.

20. The non-volatile memory device of claim 15, wherein a first distance between the second conductive pattern and the first electrode is less than a second distance between the second conductive pattern and the second electrode.

* * * * *